(12) United States Patent
Ni et al.

(10) Patent No.: US 10,886,401 B2
(45) Date of Patent: Jan. 5, 2021

(54) SEMICONDUCTOR DEVICE WITH WELL REGION AND PROTECTION REGION ELECTRICALLY CONNECTED BY CONNECTION REGION

(71) Applicant: NISSAN MOTOR CO., LTD., Yokohama (JP)

(72) Inventors: Wei Ni, Kanagawa (JP); Tetsuya Hayashi, Kanagawa (JP); Yasuaki Hayami, Kanagawa (JP); Ryota Tanaka, Kanagawa (JP)

(73) Assignee: NISSAN MOTOR CO., LTD.

( * ) Notice: Subject to any disclaimer, the term of this patent is extended or adjusted under 35 U.S.C. 154(b) by 0 days.

(21) Appl. No.: 16/305,170

(22) PCT Filed: May 30, 2016

(86) PCT No.: PCT/JP2016/065909
§ 371 (c)(1),
(2) Date: Nov. 28, 2018

(87) PCT Pub. No.: WO2017/208301
PCT Pub. Date: Dec. 7, 2017

(65) Prior Publication Data
US 2019/0341486 A1    Nov. 7, 2019

(51) Int. Cl.
*H01L 29/78*  (2006.01)
*H01L 29/06*  (2006.01)
(Continued)

(52) U.S. Cl.
CPC ........ *H01L 29/7825* (2013.01); *H01L 29/063* (2013.01); *H01L 29/0619* (2013.01);
(Continued)

(58) Field of Classification Search
USPC ........................................................ 257/107
See application file for complete search history.

(56) References Cited

U.S. PATENT DOCUMENTS

2003/0141514 A1* 7/2003 Yamaguchi ....... H01L 29/66348
257/107
2006/0038223 A1* 2/2006 Darwish ............. H01L 29/0634
257/330
(Continued)

FOREIGN PATENT DOCUMENTS

EP           3 024 018 A1    5/2016
JP         2001-274398 A    10/2001
(Continued)

*Primary Examiner* — Sheng-Bai Zhu
(74) *Attorney, Agent, or Firm* — Foley & Lardner LLP

(57) ABSTRACT

A semiconductor device includes: a substrate; a drift region formed on a main surface of the substrate; a well region formed in a main surface of the drift region; a source region formed in the well region; a gate groove formed from the main surface of the drift region in a perpendicular direction while being in contact with the source region, the well region, and the drift region; a drain region formed in the main surface of the drift region; a gate electrode formed on a surface of the gate groove with a gate insulating film interposed therebetween; a protection region formed on a surface of the gate insulating film facing the drain region; and a connection region formed in contact with the well region and the protection region.

13 Claims, 30 Drawing Sheets

(51) Int. Cl.
*H01L 29/08* (2006.01)
*H01L 29/423* (2006.01)
*H01L 29/66* (2006.01)
H01L 21/8234 (2006.01)
H01L 29/16 (2006.01)

(52) U.S. Cl.
CPC ...... *H01L 29/0696* (2013.01); *H01L 29/0878* (2013.01); *H01L 29/4236* (2013.01); *H01L 29/66704* (2013.01); *H01L 21/823462* (2013.01); *H01L 29/1608* (2013.01)

(56) References Cited

U.S. PATENT DOCUMENTS

| | | |
|---|---|---|
| 2007/0108469 A1 | 5/2007 | Nakano et al. |
| 2011/0210391 A1* | 9/2011 | Kitagawa ............ H01L 29/7825 257/331 |
| 2015/0357415 A1* | 12/2015 | Kagawa ............ H01L 29/66068 257/77 |

FOREIGN PATENT DOCUMENTS

| | | |
|---|---|---|
| JP | 2011-54881 A | 3/2011 |
| WO | WO 2014/122919 A1 | 8/2014 |
| WO | WO 2015/008550 A1 | 1/2015 |

\* cited by examiner

SEMICONDUCTOR DEVICE WITH WELL REGION AND PROTECTION REGION ELECTRICALLY CONNECTED BY CONNECTION REGION

TECHNICAL FIELD

The present invention relates to a semiconductor device.

BACKGROUND ART

Patent Literature 1 discloses a semiconductor device in which a well region forming channels, a source region, and a drain region are formed within a drift region from a surface of the drift region in a direction perpendicular thereto. By use of a substrate having a lower impurity concentration than the drift region and the well region having an end portion extending to the substrate, this semiconductor device reduces electric field concentration at the well region to improve voltage withstand performance.

CITATION LIST

Patent Literature

Patent Literature 1: Japanese Patent Application Publication No. 2001-274398

SUMMARY OF INVENTION

Technical Problem

When higher voltage withstand performance is required of the semiconductor device described in Patent Literature 1, a protection region of a conductivity type different from that of the drift region may be formed to mitigate electric field concentration between a gate electrode and the drift region. To make the protection region have the same potential as the source, metal wiring may be connected to the surface of the protection region via a contact hole. In such a case, an area is needed for the connection to the protection region, and this may lead to an increase in the size of the element.

In view of the above problem, the present invention aims to provide a semiconductor device capable of improving voltage withstand performance without increasing in size.

Solution to Problem

A semiconductor device according to an aspect of the present invention includes: a substrate; a drift region of a first conductivity type formed on a main surface of the substrate; a well region of a second conductivity type formed in a main surface of the drift region; a source region of the first conductivity type formed in the well region; a gate groove formed from the main surface of the drift region in a perpendicular direction while being in contact with the source region, the well region, and the drift region; a drain region of the first conductivity type formed in the main surface of the drift region; a gate electrode formed on a surface of the gate groove with a gate insulating film interposed therebetween; a protection region of the second conductivity type formed on a surface of the gate insulating film facing the drain region; and a connection region of the second conductivity type formed in contact with the well region and the protection region.

Advantageous Effects of Invention

The aspect of the present invention can provide a semiconductor device capable of improving voltage withstand performance without increasing in size.

DESCRIPTION OF EMBODIMENTS

First and second embodiments of the present invention will be described below with reference to the drawings. Throughout the drawings, the same or like portions are denoted by the same or like reference signs to omit repeated descriptions. Note that the drawings are schematic, and dimensional relations, ratios and the like may be different from actual ones. In addition, some dimensional relations and ratios may be different from one drawing to another. Further, the following embodiments are provided to present examples of a device and a method for embodying the technical concept of the present invention, and the technical concept of the present invention is not limited to the materials, shapes, structures, arrangements, and the like of constituents described below.

Furthermore, in the embodiments below, a "first conductivity type" and a "second conductivity type" are opposite conductivity types from each other. Thus, if the first conductivity type is an n type, the second conductivity type is a p type, and if the first conductivity type is a p type, the second conductivity type is an n type. Although the following describes a case where the first conductivity type is an n type and the second conductivity type is a p type, the first conductivity type may be a p type, and the second conductivity type may be an n type. When an n type and a p type are interchanged, the polarities of applied voltage are also inverted.

First Embodiment

Figure 1:
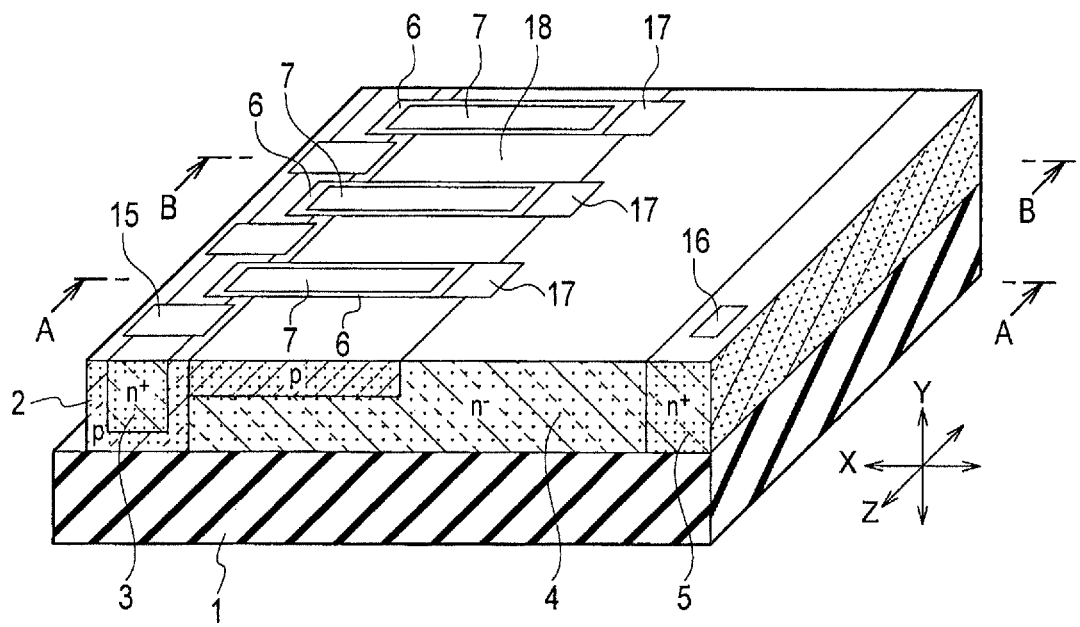
FIG. 1 is a perspective view illustrating a semiconductor device according to a first embodiment of the present invention.
Figure 2A:
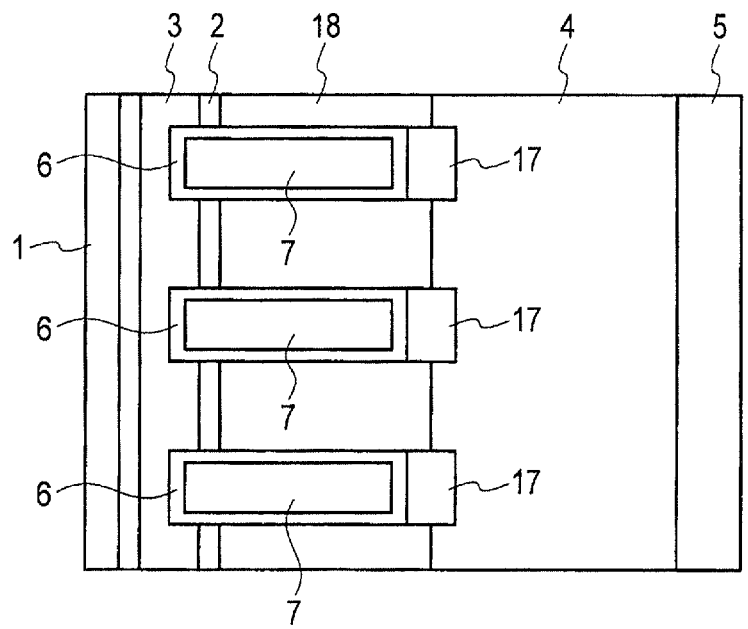
FIG. 2A is a top view corresponding to FIG. 1.
Figure 2B:
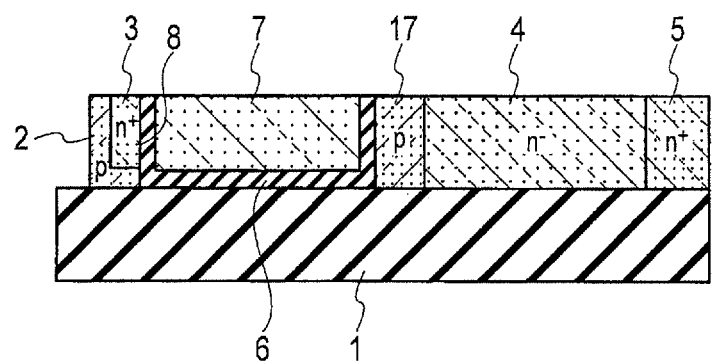
FIG. 2B is a sectional view seen in the direction A-A in FIG. 1.
Figure 2C:
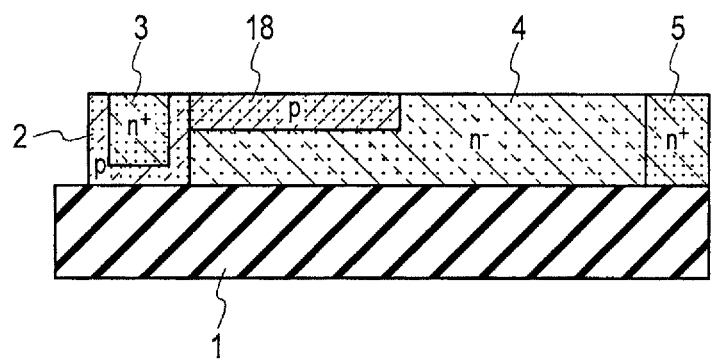
FIG. 2C is a sectional view seen in the direction B-B in FIG. 1.

FIG. 1 is a perspective view schematically illustrating the configuration of a semiconductor device according to a first embodiment of the present invention. FIG. 2A is a top view corresponding to FIG. 1. FIG. 2B is a sectional view seen in the direction A-A in FIG. 1. FIG. 2C is a sectional view seen in the direction B-B in FIG. 1. The first embodiment exemplifies a semiconductor device having three metal-oxide-semiconductor field-effect transistors (MOSFETs) as a plurality of semiconductor elements. More semiconductor elements may be arranged in two axis directions on a plane (the X-axis direction and the Z-axis direction). Note that FIG. 1 omits illustration of electrode wiring to facilitate an understanding.

As illustrated in FIGS. 1 and 2A to 2C, the semiconductor device according to the first embodiment includes a substrate 1, a well region 2, a source region 3, a drift region 4, a drain region 5, gate insulating films 6, gate electrodes 7, gate grooves 8, source electrodes 15, a drain electrode 16, protection regions 17, and a connection region 18.

The substrate 1 is a flat plate made of, for example, a semi-insulator or an insulator. Herein, an insulator means a substrate with a sheet resistance of several k $\Omega$/sq or above, and a semi-insulator means a substrate with a sheet resistance of several tens of $\Omega$/sq or above. For example, silicon carbide (SiC) may be used as a material for the substrate 1. The first embodiment describes a case where the substrate 1 is made of SiC, which is an insulator. The substrate 1 has a thickness of, for example, approximately several tens of μm to several hundreds of μm.

The drift region 4 is an n⁻-type region formed on one main surface of the substrate 1 (hereinafter referred to as a "first main surface"). The impurity concentration of the drift region 4 is higher than that of the substrate 1, and is, for example, approximately $1\times10^{14}$ cm$^{-3}$ to $1\times10^{18}$ cm$^{-3}$. The drift region 4 is made of the same material as the substrate 1, and is, for example, an epitaxial growth layer made of SiC if the substrate 1 is made of SiC. The drift region 4 has a thickness of, for example, approximately a few μm to several tens of μm.

The well region 2 is a p-type region extending within the drift region 4 from a main surface of the drift region 4 (hereinafter referred to as a "second main surface") opposite from a main surface of the drift region 4 in contact with the substrate 1 (hereinafter referred to as a "first main surface") to the first main surface of the drift region 4 in a direction perpendicular to the second main surface of the drift region 4 (the Y-axis direction). Herein, "an end portion of the well region 2" refers to a portion where the bottom surface of the well region 2 parallel to the first main surface of the drift region 4 intersects with an end surface of the well region 2 facing the drift region 4. The bottom surface of the well region 2 may be higher or lower than the first main surface of the drift region 4. The well region 2 extends in one direction parallel to the second main surface of the drift region 4 (the Z-axis direction). The impurity concentration of the well region 2 is, for example, approximately $1\times10^{15}$ cm$^{-3}$ to $1\times10^{19}$ cm$^{-3}$.

The source region 3 extends in the well region 2 from the second main surface of the drift region 4 in the direction perpendicular to the second main surface of the drift region 4 (the Y-axis direction). The source region 3 extends parallel to the well region 2 in one direction parallel to the second main surface of the drift region 4 (the Z-axis direction). The source region 3 has the same conductivity type as the drift region 4. The impurity concentration of the source region 3 is higher than that of the drift region 4, and is, for example, approximately $1 \times 10^{18}$ cm$^{-3}$ to $1 \times 10^{21}$ cm$^{-3}$.

The source region 3 and the well region 2 are electrically connected to the source electrodes 15 formed at the exposed surface and have the same potential as each other. For example, a conductor containing a metal material such as nickel (Ni), a titanium (Ti), or molybdenum (Mo) is usable as a material for the source electrodes 15. Note that FIGS. 2A and 2C do not show the source electrodes 15.

Each gate groove 8 is, as illustrated in FIG. 2B, a groove formed from the second main surface of the drift region 4 to the first main surface of the drift region 4 in the direction perpendicular to the second main surface of the drift region 4 (the Y-axis direction). The gate groove 8 extends in a direction (the X-axis direction) parallel to the second main surface of the drift region 4 and orthogonal to the direction in which the source region 3 and the well region 2 extend, and is in contact with the source region 3, the well region 2, and the drift region 4. The bottom surface of the gate groove 8 does not need to coincide with the first main surface of the drift region 4, and for example, may be higher than the bottom surface of the source region 3 or coincide with the bottom surface of the source region 3. The gate grooves 8 are arranged in a direction (the Z-axis direction) parallel to the second main surface of the drift region 4 and orthogonal to the direction in which the gate grooves 8 extend.

The gate insulating film 6 is formed over the entire surface of the gate groove 8. For example, an insulator such as silicon oxide film (SiO$_2$ film) is usable as a material for the gate insulating film 6. The gate electrode 7 is formed in the gate groove 8, at least on the surface of the gate insulating film 6. In other words, the gate electrode 7 is formed on the surface of the gate groove 8 with the gate insulating film 6 interposed therebetween. For example, a conductor such as n-type polysilicon is usable as a material for the gate electrode 7.

The drain region 5 is an n$^+$-type region formed in the drift region 4, away from the well region 2. The drain region 5 extends from the second main surface of the drift region 4 to the first main surface of the drift region 4 in the direction perpendicular to the second main surface of the drift region 4 (the Y-axis direction). The drain region 5 may be shallower than the thickness of the drift region 4. The drain region 5 extends in a direction in which the well region 2 and the source region 3 extend (the Z-axis direction). The drain region 5 has the same conductivity type as the drift region 4. The impurity concentration of the drain region 5 is higher than that of the drift region 4 and substantially the same as that of the source region 3, and is, for example, approximately $1 \times 10^{18}$ cm$^{-3}$ to $1 \times 10^{21}$ cm$^{-3}$.

The drain region 5 is electrically connected to the drain electrode 16 formed at the exposed surface. For example, a conductor containing a metal material such as nickel (Ni), a titanium (Ti), or molybdenum (Mo) is usable as a material for the drain electrode 16. Note that FIGS. 2A and 2C omit the illustration of the drain electrode 16.

The protection regions 17 are each a p-type region formed in the drift region 4 on a surface of the gate insulating film 6 facing the drain region 5. In other words, the protection region 17 is formed in contact with an entire end surface of the gate groove 8 facing the drain region 5. In other words, the protection region 17 is as deep as the gate groove 8 and is as wide as the gate groove 8. Note that the widths of the protection region 17 and the gate groove 8 are widths in a direction (the Z-axis direction) along the second main surface of the drift region 4 and orthogonal to a main current direction (the X-axis direction). The impurity concentration of the protection region 17 is, for example, approximately $1 \times 10^{15}$ cm$^{-3}$ to $1 \times 10^{19}$ cm$^{-3}$.

The connection region 18 is a p-type region formed in the drift region 4 while in contact with the well region 2 and the protection region 17. The connection region 18 is formed from the second main surface of the drift region 4 to a depth shallower than the depth of the gate groove 8. The connection region 18 is formed in a range, in the direction in which the gate groove 8 extends (the X-axis direction), from the end surface of the well region 2 facing the drain region 5, beyond the end surface of the gate groove 8 facing the drain region 5, to a position not beyond the end surface of the protection region 17 facing the drain region 5. In other words, the connection region 18 is in contact with the gate insulating film 6 forming side surfaces of the gate groove 8 along the direction in which the gate groove 8 extends (the X-axis direction). The connection region 18 has a higher impurity concentration than the well region 2. The impurity concentration of the connection region 18 is, for example, approximately $1 \times 10^{15}$ cm$^{-3}$ to $1 \times 10^{19}$ cm$^{-3}$.

The well region 2 and the protection region 17 are electrically connected to each other by the connection region 18. In other words, the source region 3, the well region 2, the source electrode 15, the protection region 17, and the connection region 18 are electrically connected to one another and have the same potential as each other.

Next, a description is given of the basic operation of the semiconductor device according to the first embodiment of the present invention.

The semiconductor device according to the first embodiment functions as a transistor when the potential of the gate electrode 7 is controlled based on the potential of the source electrode 15 with a positive potential applied to the drain electrode 16. In other words, when the voltage between the gate electrode 7 and the source electrode 15 is equal to or above a predetermined threshold, an inversion layer to be a channel is formed in the well region 2 located at a side surface of each gate electrode 7, bringing the semiconductor device to an ON state, so that currents flow from the drain electrode 16 to the source electrode 15. Specifically, electrons flow from the source electrode 15 to the source region 3 and then from the source region 3 into the drift region 4 via the channel. Further, the electrons flow from the drift region 4 to the drain region 5, and finally to the drain electrode 16.

On the other hand, when the voltage between the gate electrode 7 and the source electrode 15 is equal to or below the predetermined threshold, the inversion layer in the well region 2 disappears, bringing the semiconductor device to an OFF state, so that currents between the drain electrode 16 and the source electrode 15 are shut off. In this event, a high voltage of several hundreds of V to several thousands of V may be applied between the drain and the source.

In general, the voltage between the gate and the drain is withstood by the gate insulating film facing the drain region and a depletion layer spreading in the drift region. In this event, the electric field concentrates at the interface between the gate insulating film and the drift region. Since the gate insulating film is usually approximately several tens of nm, dielectric breakdown may occur.

Since the semiconductor device according to the first embodiment includes the protection region. 17 having the same potential as the source region 3, the depletion layer spreads to the protection region 17 upon application of a high voltage to the drain region 5. Then, the voltage between the gate electrode 7 and the drain region 5 is withstood by the gate insulating film 6 facing the drain region 5, the depletion layer in the protection region 17, and the depletion layer in the drift region 4. Among these, the joint interface between the protection region 17 and the drift region 4 experiences the strongest electric field. Thus, the protection region 17 can protect the gate insulating film 6 from dielectric breakdown and improve voltage withstand performance.

Further, since the semiconductor according to the first embodiment includes the connection region 18 that is in contact with the well region 2 and the protection region 17 and has the same conductivity type as the well region 2 and the protection region 17, the source region 3 and the protection region 17 can be electrically connected to each other. Thus, metal wiring and a contact hole for connecting the protection region 17 are unnecessary, and the surface of the protection region 17 does not need to be wider than a contact hole. For this reason, the element does not increase in size, and the number of elements formable per unit area does not decrease.

In addition, in the semiconductor device according to the first embodiment, the surface area of the protection region 17 does not need to be increased, and therefore the protection region 17 is not wider than the gate groove 8. If the protection region 17 were wider than the gate groove 8, the protection region 17 would hinder flow of main currents from the drain region 5 to the source region 3 in the ON state, possibly increasing the on-resistance per unit area. In the semiconductor according to the first embodiment, the protection region 17 can protect the gate insulating film 6 without increasing on-resistance per unit area.

In addition, in the semiconductor according to the first embodiment, the connection region 18 has a higher impurity concentration than the well region 2, and therefore the resistance of the connection region 18 can be reduced to improve conductivity. Thereby, in the semiconductor device according to the first embodiment, the potential of the source region 3 and the protection region 17 can be fixed more easily, and the risk of malfunctioning can be reduced.

In addition, in the semiconductor device according to the first embodiment, the substrate 1 is made of an insulator or a semi-insulator, and the end portion of the well region 2 is in contact with the substrate 1. Thereby, electric field concentration at the end portion of the well region 2 can be reduced, and voltage withstand performance can be further improved.

In addition, in the semiconductor device according to the first embodiment, the substrate 1 and the drift region 4 are formed of the same material, and therefore the possibility of warpage due to stress can be reduced, and reliability of the element can be improved.

(First Modification)

Figure 3:
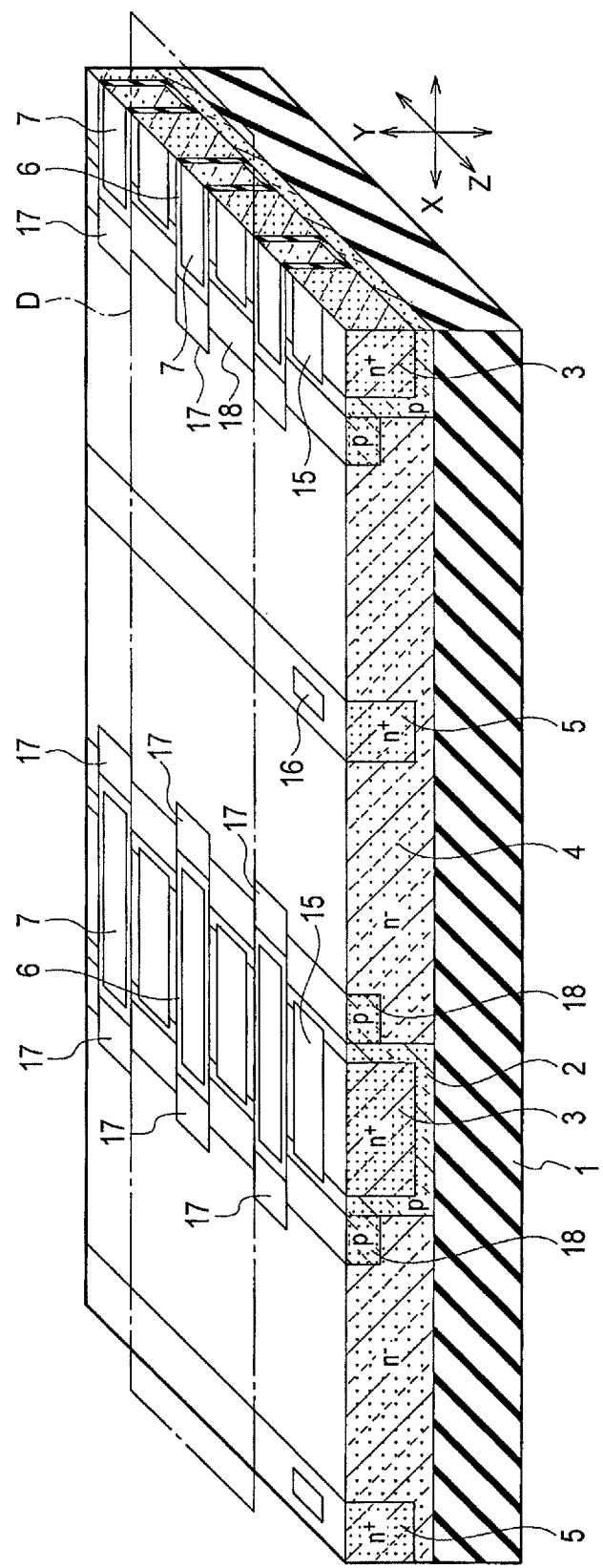
FIG. 3 is a perspective view illustrating a semiconductor device according to a first modification of the first embodiment of the present invention.

FIG. 3 is a perspective view illustrating a semiconductor device according to a first modification of the first embodiment of the present invention. The semiconductor device according to the first modification of the first embodiment differs from the first embodiment described above in that a plurality of semiconductor devices and a plurality of semiconductor devices are connected to each other in parallel. Configurations, operations, and advantageous effects not described in the first modification of the first embodiment are substantially the same as those described in the first embodiment, and are omitted to avoid repetition.

In the first modification of the first embodiment, a plurality of well regions 2 are arranged parallel to and away from one another, in a direction (the X-axis direction) parallel to the second main surface of the drift region 4 and orthogonal to the direction in which the well regions 2 extend (the Z-axis direction). In the respective well regions 2, a plurality of source regions 3 are formed. A plurality of drain regions 5 are formed so that each drain region 5 may be between adjacent ones of the well regions 2 with spaces from the well regions 2.

The gate grooves 8 extend in a direction (the X-axis direction) which is parallel to the second main surface of the drift region 4 and in which the well regions 2 are arranged, the gate grooves 8 being in contact with the drift region 4 at both sides in the direction (the X-axis direction) in which the well regions 2 are arranged. In other words, the gate grooves 8 penetrate the well region 2 and the source region 3.

The protection regions 17 are formed to be in contact with both end surfaces of each gate groove 8 facing the respective drain regions 5. The connection regions 18 are formed in areas from both end surfaces of each well region 2 in the direction in which the well regions 2 are arranged (the X-axis direction) to positions in contact with the protection regions 17 located on both sides.

Next, with reference to FIGS. 4 to 11, a description is given of an example method of manufacturing the semiconductor device according to the first modification of the first embodiment. To facilitate an understanding, FIGS. 4 to 11 show unit element cells connected in parallel in the region D in FIG. 3.

Figure 4:
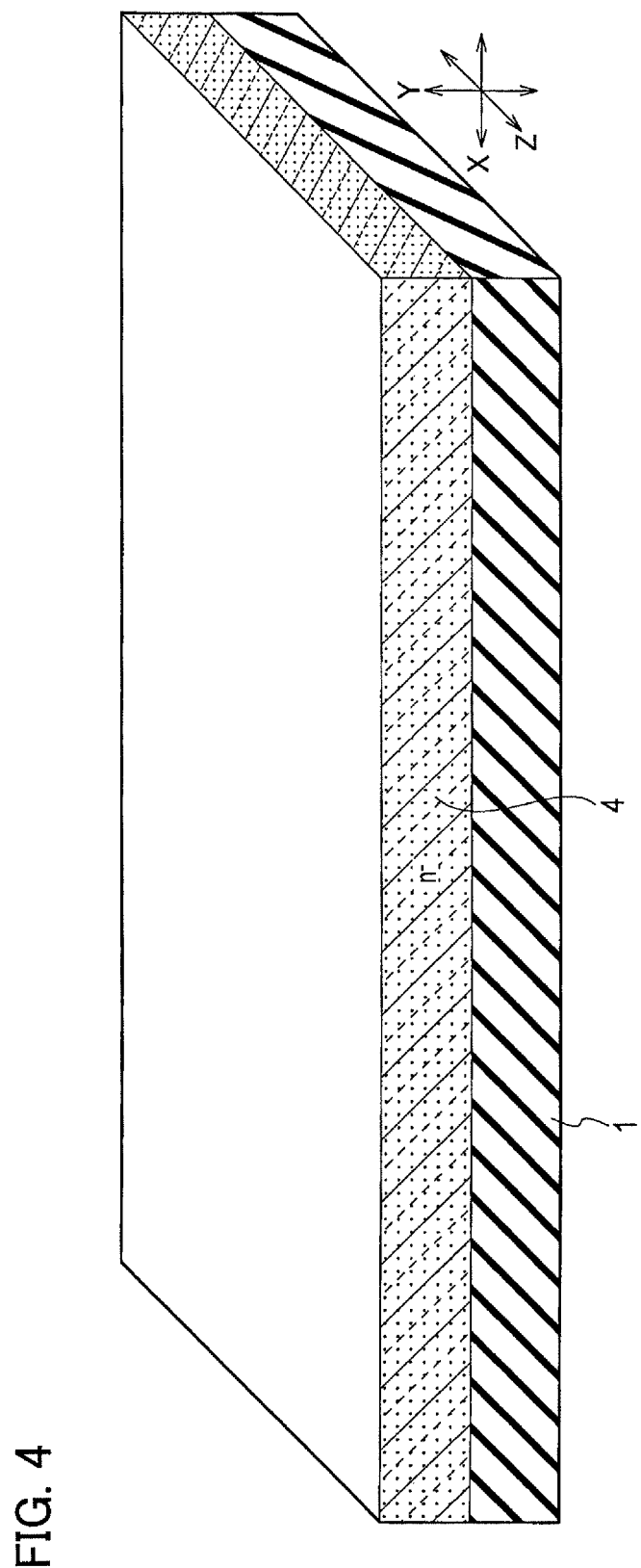
FIG. 4 is a perspective view illustrating a method of manufacturing the semiconductor device according to the first modification of the first embodiment of the present invention.

First, as illustrated in FIG. 4, a substrate 1 is prepared. The substrate 1 is an insulating substrate made of non-doped SiC, and has a thickness of approximately several tens of μm to several hundreds of μm. An n$^-$-type SiC epitaxial layer is formed on the substrate 1 as a drift region 4. While there are several polytypes of SiC, the representative 4H is used herein. For example, the drift region 4 formed has an impurity concentration of $1 \times 10^{14}$ cm$^{-3}$ to $1 \times 10^{18}$ cm$^{-3}$ and a thickness of a few μm to several tens of μm.

Figure 5:
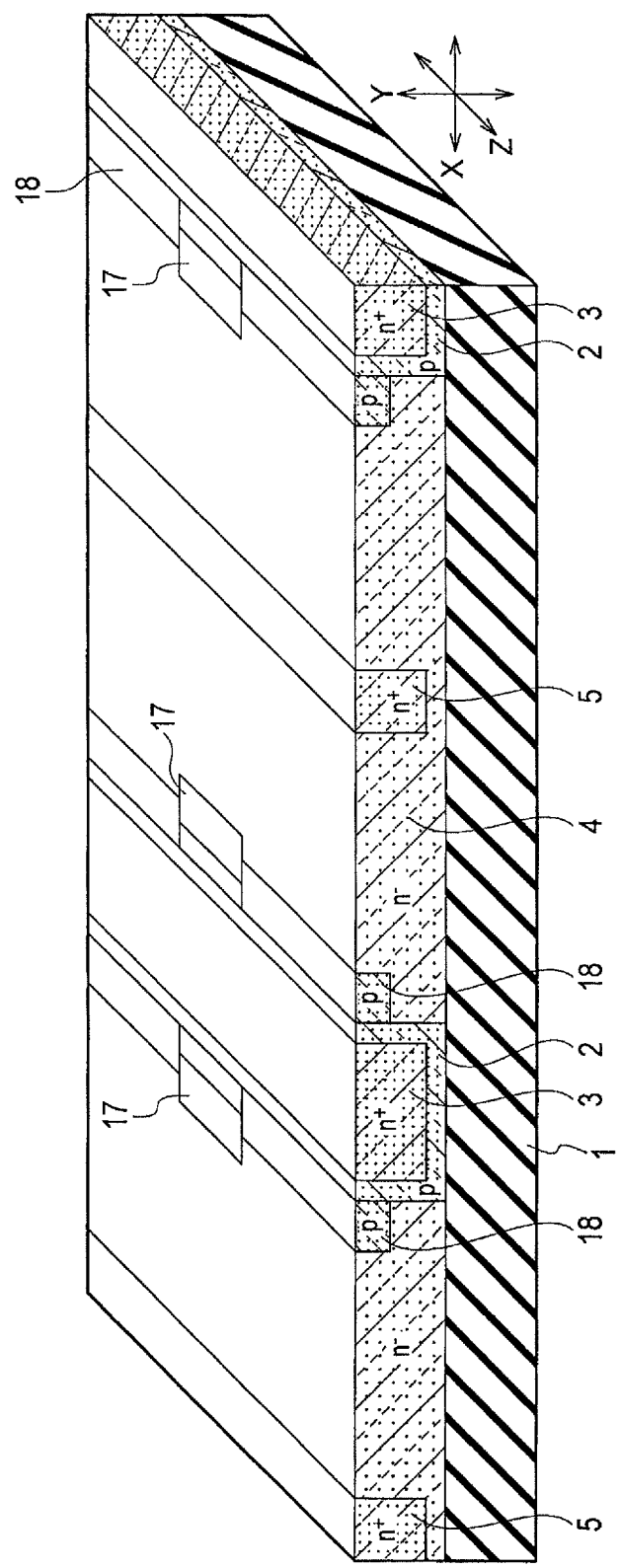
FIG. 5 is a perspective view following FIG. 4, illustrating the method of manufacturing the semiconductor device according to the first modification of the first embodiment of the present invention.

Next, as illustrated in FIG. 5, p-type well regions 2, n$^+$-type source regions 3, n$^+$-type drain regions 5, p-type protection regions 17, and p-type connection regions 18 are formed on the drift region 4. The order of the formation is as follows. Preferably, the well regions 2 are formed first. Thereafter, the source regions 3 and the drain regions 5 may be formed simultaneously. The well regions 2, the source regions 3, the drain regions 5, the protection regions 17, and the connection region 18 are formed using ion implantation.

To mask regions not to be ion-implanted, a mask material may be formed on the drift region 4 by the following steps. A silicon oxide film (SiO$_2$ film) can be used as the mask material, and thermal chemical vapor deposition (thermal CVD) or plasma CVD can be used as a deposition method. Next, a resist is applied to the mask material and is patterned using typical photolithography. With the patterned resist used as a mask, the mask material is partially and selectively removed by etching. As the etching method, wet etching using hydrofluoric acid or dry etching such as reactive ion etching (RIE) can be used. Next, the resist is removed using oxygen plasma, sulfuric acid, or the like.

Thereafter, with the mask material used as a mask, p-type and n-type impurities are ion-implanted to the drift region 4 to form the p-type well regions 2, protection regions 17, and connection regions 18, as well as the n$^+$-type source regions 3 and drain regions 5. For example, aluminum (Al) or boron (B) can be used as the p-type impurities. Further, for example, nitrogen (N) can be used as the n-type impurities. In this step, when the ion implantation is performed with the base temperature being heated at approximately 300° C. to 600° C., crystal defects occurring in the implanted region can be reduced. After the ion implantation, the mask material is removed using, for example, wet etching with hydrofluoric acid.

Next, the ion-implanted impurities are annealed to be activated. The annealing temperature is, for example, approximately 1700° C., and argon (Ar) or nitrogen ($N_2$) can be favorably used as the atmosphere. Further, favorable impurity concentrations of the source regions 3 and the drain regions 5 formed by the above method are $1\times10^{18}$ $cm^{-3}$ to $1\times10^{21}$ $cm^{-3}$, and their implantation depths are shallower than the first main surface of the drift region 4. Further, favorable impurity concentrations of the well regions 2, the protection regions 17, and the connection regions 18 are $1\times10^{15}$ $cm^{-3}$ to $1\times10^{19}$ $cm^{-3}$. The implantation depths of the well regions 2 and the protection region 17 may be deeper than the first main surface of the drift region 4, so that the end portions of the well regions 2 reach the inside of the substrate 1. The implantation depth of the connection region 18 is shallower than the first main surface of the drift region 4. For example, the implantation energy may be MKeV level or higher when the thickness of the drift region 4 is 1 μm or larger.

Figure 6:
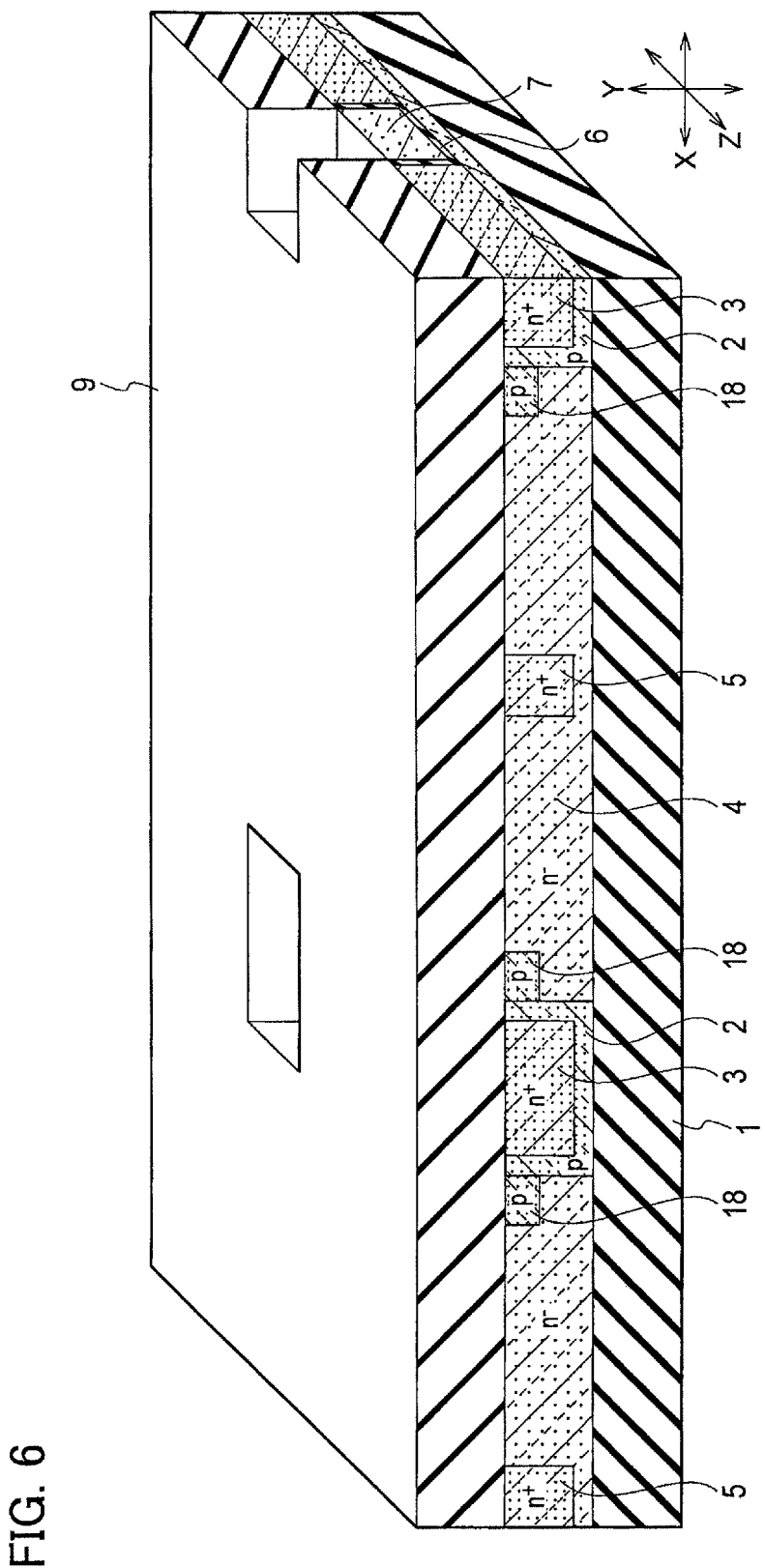
FIG. 6 is a perspective view following FIG. 5, illustrating the method of manufacturing the semiconductor device according to the first modification of the first embodiment of the present invention.

Next, as illustrated in FIG. 6, a mask material 9 is formed to form gate grooves 8 in the drift region 4. A patterned insulating film can be used as the mask material 9, like the mask material used in the step described using FIG. 5. Next, the gate grooves 8 are formed with the mask material 9 used as a mask. Note that the structure after the formation of the gate grooves 8 is not shown. Dry etching such as RIE is favorably used to form the gate grooves 8. The gate grooves 8 are formed shallower than the source regions 3. After the formation of the gate grooves 8, the mask material 9 is removed. For example, when the mask material 9 is a silicon oxide film, the mask material 9 is removed by hydrofluoric acid cleaning.

Figure 7:
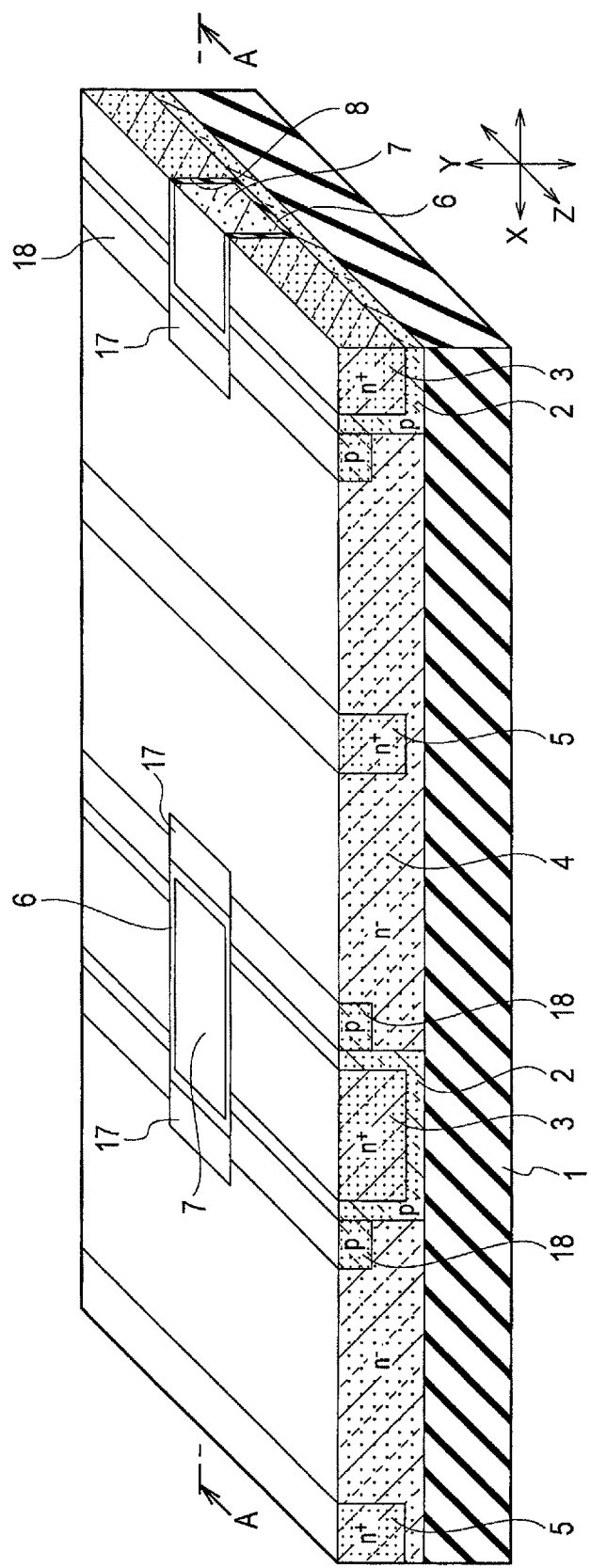
FIG. 7 is a perspective view following FIG. 6, illustrating the method of manufacturing the semiconductor device according to the first modification of the first embodiment of the present invention.
Figure 8:
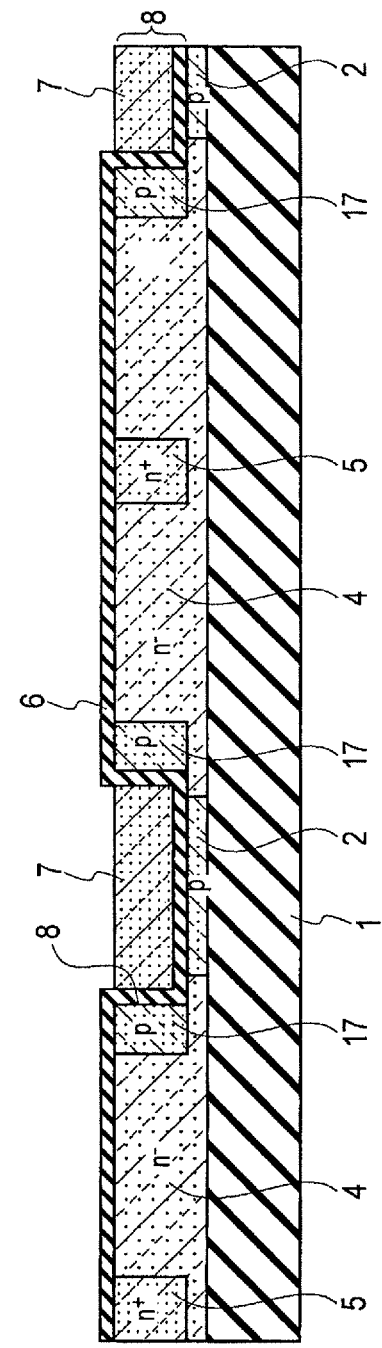
FIG. 8 is a sectional view seen in the direction A-A in FIG. 7.

Next, as illustrated in FIGS. 7 and 8, a gate insulating film 6 and gate electrodes 7 are formed. Specifically, first, the gate insulating film 6 is formed on the drift region 4 and the surfaces of the gate grooves 8 by the thermal oxidation method or the deposition method. For example, in the case of thermal oxidation, when the base is heated at a temperature of approximately 1100° C. in an oxygen atmosphere, a silicon oxide film is formed on all the portion of the base that is in contact with oxygen. After the formation of the gate insulating film 6, annealing at approximately 1000° C. may be performed in an atmosphere of nitrogen, argon, nitrous oxide ($N_2O$), or the like to reduce the interface state of the interfaces between the well regions 2 and the gate insulating film 6.

Thereafter, a material to be the gate electrodes 7 is deposited on the surface of the gate insulating film 6. Polysilicon is usable as the material for the gate electrodes 7. The following description assumes that polysilicon is used to form the gate electrodes 7. For the polysilicon deposition, low-pressure CVD may be used. Each gate groove 8 can be completely embedded with the polysilicon when the thickness of the polysilicon deposited is more than half the width of the gate groove 8. For example, when the width of the gate groove 8 is 2 μm, the thickness of polysilicon is more than 1 μm. After the polysilicon deposition, annealing is performed at approximately 950° C. in an atmosphere of phosphoryl chloride ($POCl_3$), thereby forming n-type polysilicon and giving conductivity to the gate electrodes 7.

Next, the polysilicon of the gate electrodes 7 is etched by isotropic etching or anisotropic etching. The amount of etching is set so that the polysilicon may remain in the gate grooves 8. For example, when the width of each gate groove 8 is 2 μm and the thickness of the polysilicon deposited is 1.5 μm, a desirable amount of etching is 1.5 μm. Note that it is not problematic even if the polysilicon is over-etched by several percentage relative to the polysilicon thickness 1.5 μm due to etching control. FIGS. 7 and 8 illustrate the structure after the etching of the polysilicon. Note that, to facilitate an understanding, FIG. 7 does not show the insulating film formed on the surface of the drift region 4 in the formation of the gate insulating film 6, but actually, the insulating film may be formed on the surface of the drift region 4 as well, as illustrated in FIG. 8.

Figure 9:
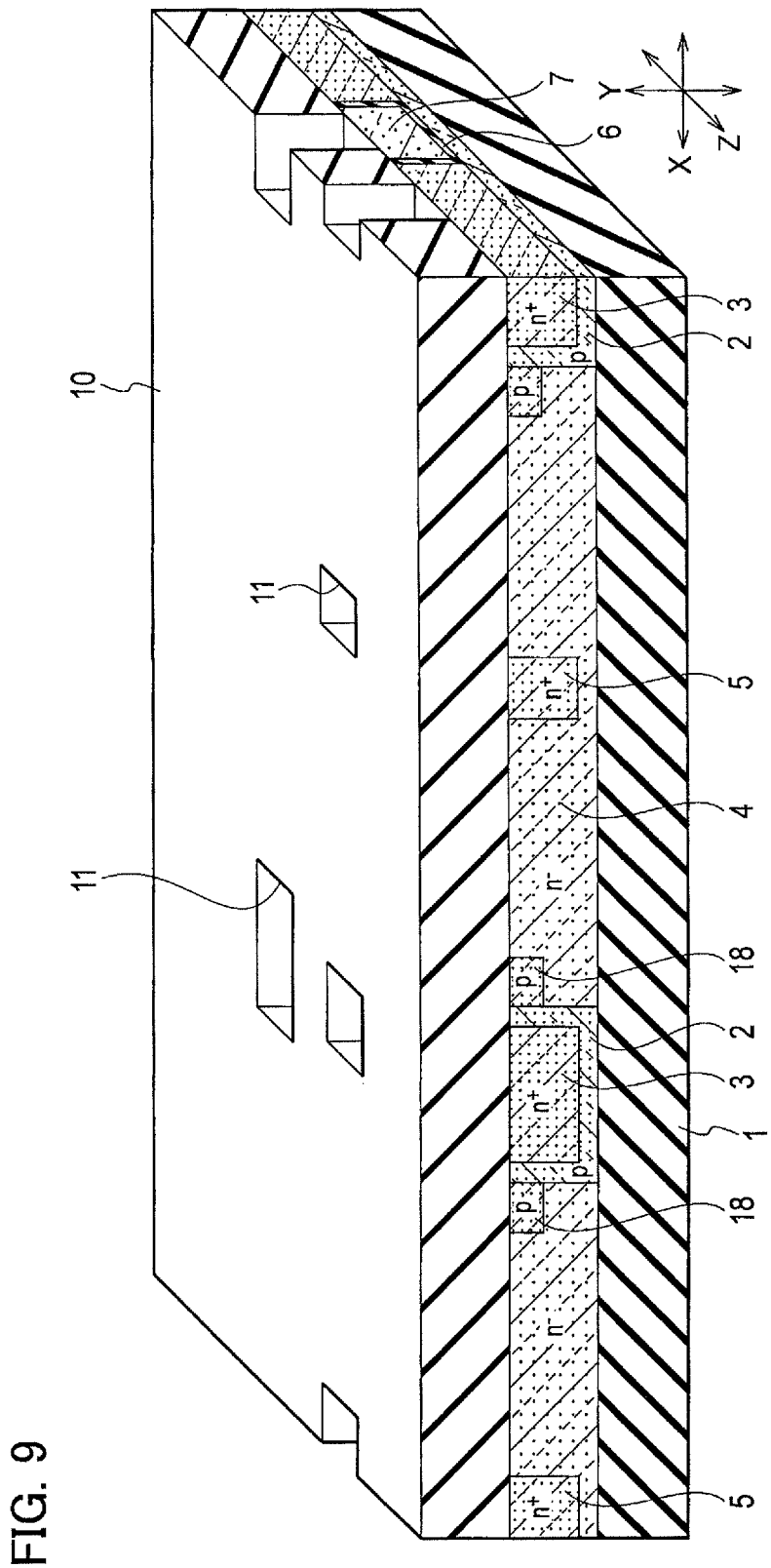
FIG. 9 is a perspective view following FIGS. 7 and 8, illustrating the method of manufacturing the semiconductor device according to the first modification of the first embodiment of the present invention.
Figure 10:
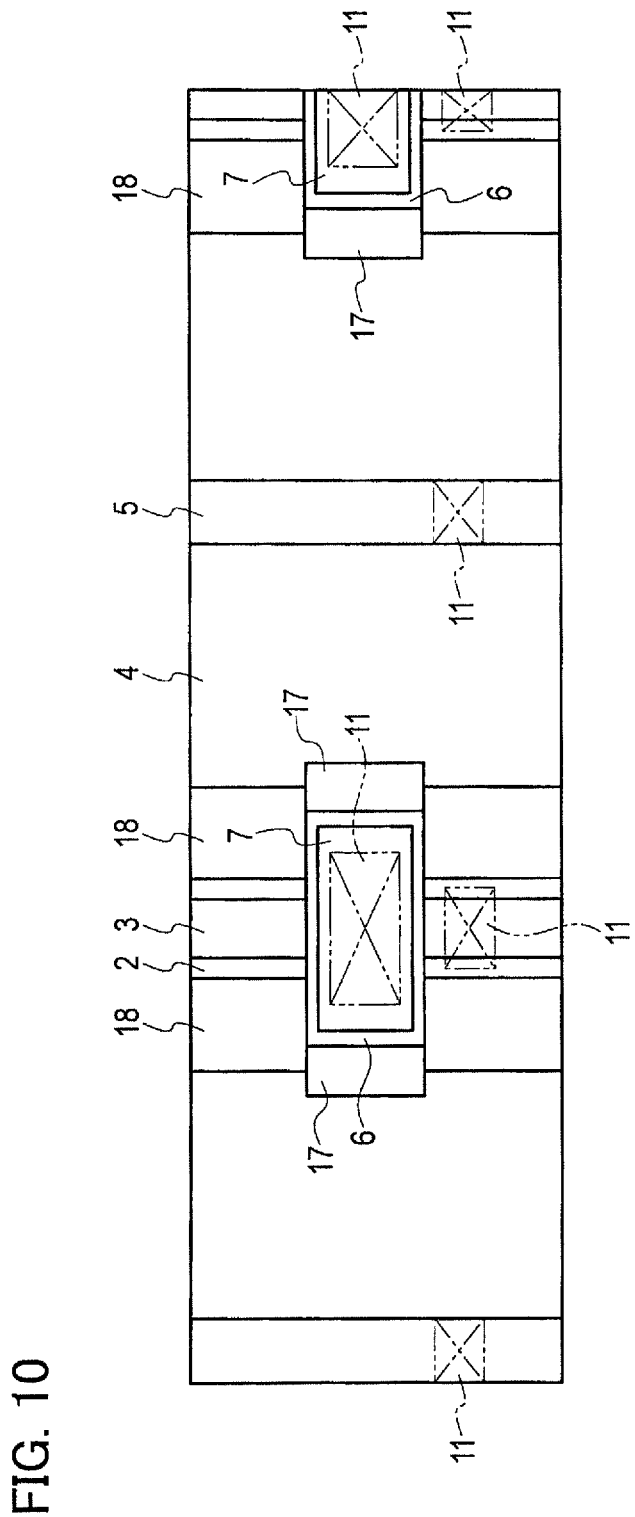
FIG. 10 is a top view corresponding to FIG. 9.

Next, as illustrated in FIGS. 9 and 10, an interlayer insulating film 10 is formed, and contact holes 11 for electrodes are formed. To facilitate an understanding, FIG. 10 does not show the interlayer insulating film 10 and shows only the positions of the contact holes 11. Generally, a silicon oxide film is favorable as the interlayer insulating film 10, and a usable deposition method is thermal CVD or plasma CVD. After the deposition of the interlayer insulating film 10, a resist is applied to the interlayer insulating film 10 and is patterned using typical photolithography (not shown). With the patterned resist used as a mask, the interlayer insulating film 10 is partially and selectively removed by wet etching using hydrofluoric acid or dry etching such as reactive ion etching (RIE) to form the contact holes 11. Thereafter, the resist is removed using oxygen plasma or sulfuric acid.

Figure 11:
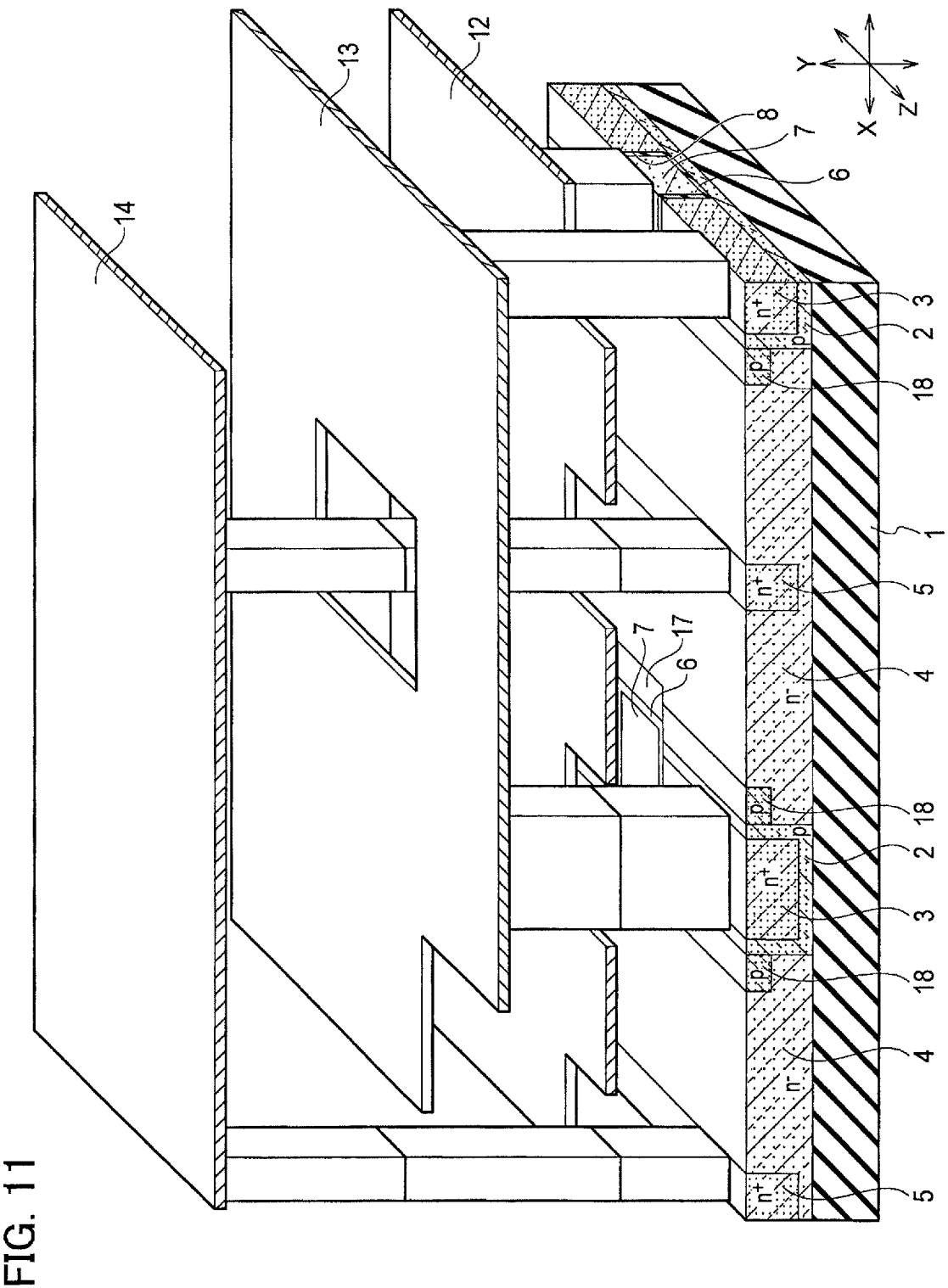
FIG. 11 is a perspective view following FIGS. 9 and 10, illustrating the method of manufacturing the semiconductor device according to the first modification of the first embodiment of the present invention.

Next, as illustrated in FIG. 11, gate wiring 12, source wiring 13, and drain wiring 14 are formed. To facilitate an understanding, FIG. 11 does not show interlayer illustrating films between the drift region 4, the gate wiring 12, the source wiring 13, and the drain wiring 14. As a wiring material, a metal material such as titanium (Ti), nickel (Ni), or molybdenum (Mo) is usable. The following description assumes that Ti is used to form the gate wiring 12, the source wiring 13, and the drain wiring 14. First, Ti is deposited using metal organic chemical vapor deposition (MOCVD) or the like. Next, with a resist or the like used as a mask, the Ti is selectively etched. Next, an interlayer insulating film between the gate wiring 12 and the source wiring 13 is deposited, and contact holes are formed. Sputtering or the like is favorably used for the deposition of the interlayer insulating film, and the contact holes can be formed in the same manner as the step described using FIGS. 9 and 10. Next, a metal material to be the source wiring 13 is deposited and then etched by the same method used for the formation of the gate wiring 12. Subsequently, an interlayer insulating film between the source wiring 13 and the drain wiring 14 is deposited, contact holes are formed, and a metal material to be the drain wiring 14 is deposited. FIG. 11 shows a semiconductor device after the formation of the drain wiring 14. The semiconductor device illustrated in FIG. 3 is completed after the steps described above.

The method of manufacturing the semiconductor device according to the first modification of the first embodiment can obtain a semiconductor device illustrated in FIG. 3 with improved voltage withstand performance without being increased in size.

Further, in the semiconductor device according to the first modification of the first embodiment, the protection regions 17 adjacent in the direction in which main currents flow (the X-axis direction) and the drift region 4 sandwiched by these protection regions 17 are fully depleted at a predetermined drain voltage or higher. Thereby, voltage withstand performance can be improved even more.

(Second Modification)

Figure 12:
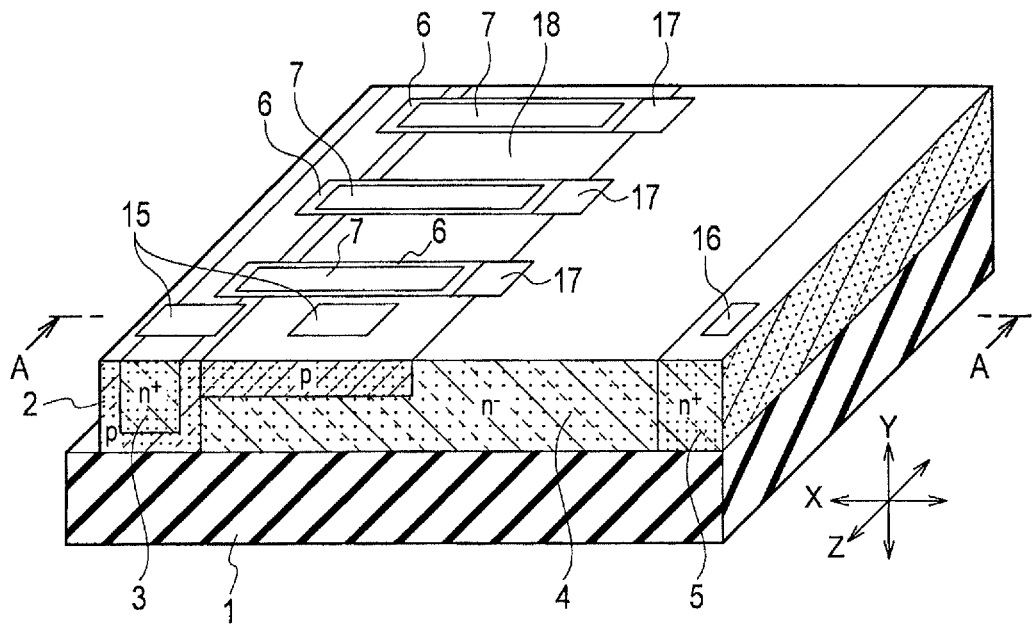
FIG. 12 is a perspective view illustrating a semiconductor device according to a second modification of the first embodiment of the present invention.
Figure 13:
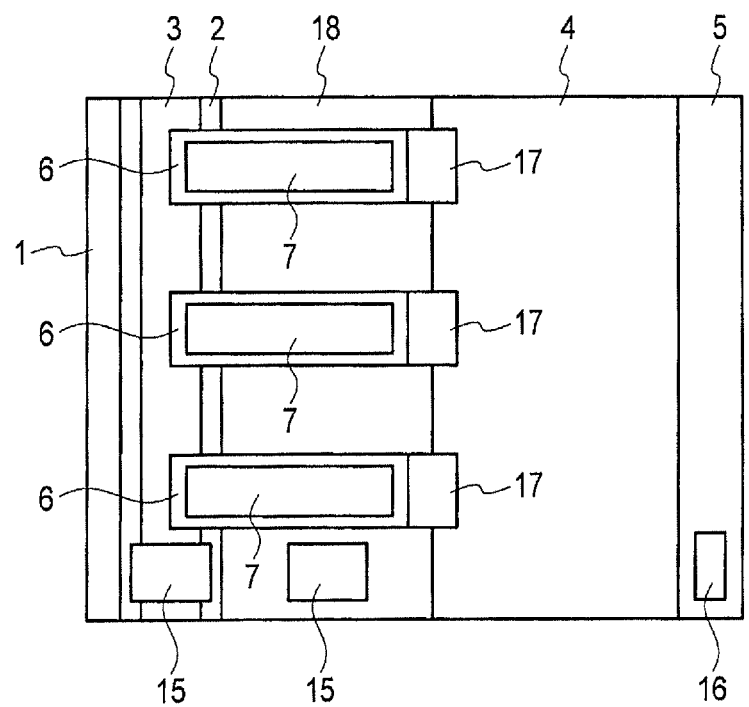
FIG. 13 is a top view corresponding to FIG. 12.

FIG. 12 is a perspective view illustrating a semiconductor device according to a second modification of the first embodiment of the present invention. FIG. 13 is a top view corresponding to FIG. 12. The semiconductor device according to the second modification of the first embodiment differs from the above first embodiment in that the connection regions 18 are in contact with the source electrodes 15. Configurations, operations, and advantageous effects not described in the second modification of the first embodiment are substantially the same as those in the above embodiment and are omitted to avoid repetition.

In the second modification of the first embodiment, the source electrodes 15 are in contact with the upper surfaces of the well region 2 and the source region 3 and the upper surface of the connection region 18. The source electrodes 15, the well region 2, the source region 3, and the connection region 18 have the same potential as each other. The source electrodes 15 are formed on the second main surface of the drift region 4. The source electrodes 15 can be formed without any change in the process, when the step illustrated in FIGS. 9 and 10 also forms a contact hole 11 in an area on the connection region 18.

Generally, since p-type SiC has relatively large resistivity, it is difficult to fix a potential. In the semiconductor element according to the second modification of the first embodiment, the connection region 18 is in direct contact with the source electrode 15, which makes it easy to fix the potential and possible to reduce the risk of malfunction.

Figure 14:
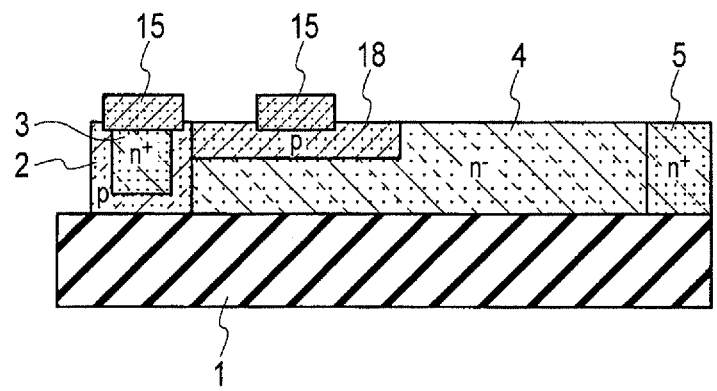
FIG. 14 is a sectional view seen in the direction A-A in FIG. 12.

Further, as illustrated in FIG. 14, in the second modification of the first embodiment, the connection region 18 may be in contact with the source electrode 15 at a position deeper than the second main surface of the drift region 4. Such a source electrode 15 can be, formed by, in the step illustrated using FIGS. 9 and 10, forming the contact hole 11 also in an area corresponding to the connection region 18, forming a groove shallower than the connection region 18 by etching similar to that used for the gate groove 8, and depositing an electrode material in the groove.

The source electrode 15 formed to be in contact at a position deeper than the upper surface of the connection region 18 is in contact not only at its bottom surface, but also at its side surfaces in the groove formed in the connection region 18, and therefore the area of contact with the connection region 18 is large. Thus, contact resistance is reduced, which makes it easy to fix the potential even more and possible to reduce the risk of malfunction.

Second Embodiment

Figure 15:
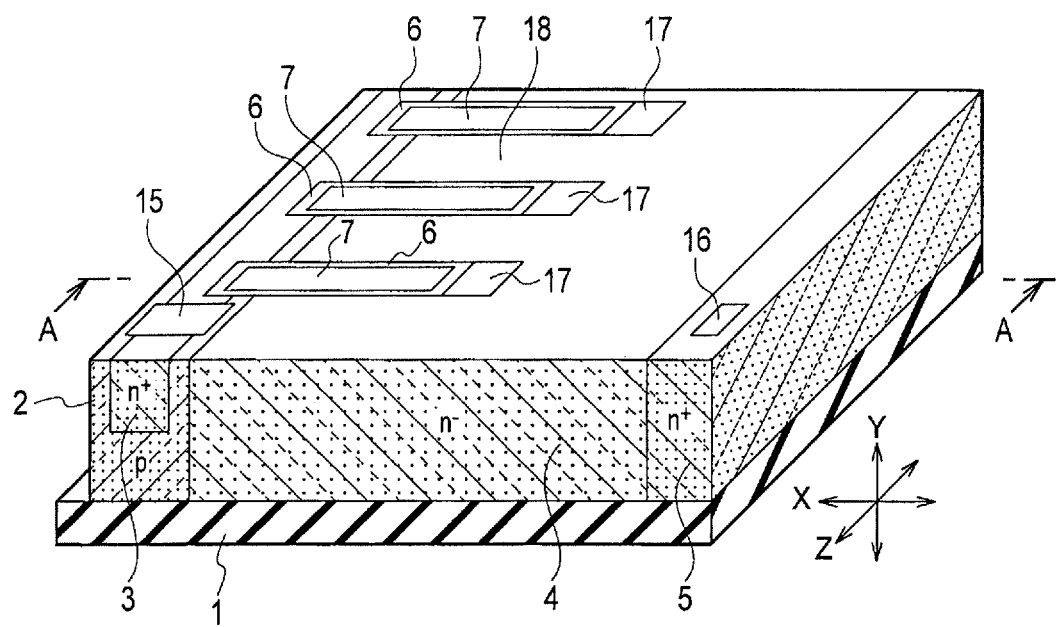
FIG. 15 is a perspective view illustrating a semiconductor device according to a second embodiment of the present invention.
Figure 16:
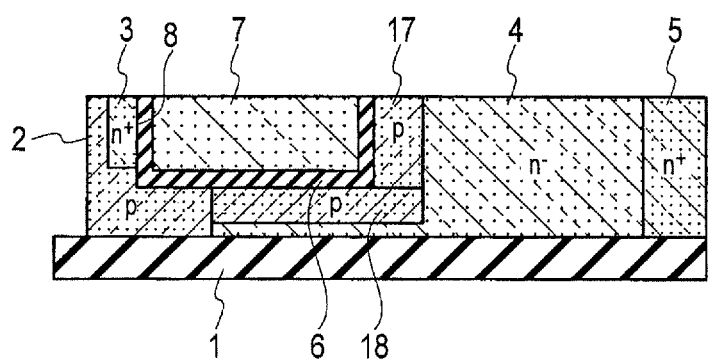
FIG. 16 is a sectional view seen in the direction A-A in FIG. 15.

FIG. 15 is a perspective view illustrating a semiconductor device according to a second embodiment of the present invention. FIG. 16 is a sectional view seen in the direction A-A in FIG. 15. The semiconductor device according to the second embodiment differs from the above first embodiment in that the connection region 18 is formed in contact with the bottom surface of the gate insulating film 6. Configurations, operations, and advantageous effects described in the second embodiment below are substantially the same as the above embodiment and are omitted to avoid repetition. To facilitate an understanding, FIGS. 15 and 16 do not show electrode wiring.

In the second embodiment, the gate groove 8 is shallower than the drift region 4. In other words, the bottom surface of the gate groove 8 is higher than the first main surface of the drift region 4. Further, as illustrated in FIG. 16, the connection region 18 is formed in contact with the bottom surface of the gate insulating film 6 facing the substrate 1. The connection region 18 extends in the direction in which the gate groove 8 extends (the X-axis direction) from the end surface of the well region 2 facing the drain region 5 to a position in contact with the bottom portion of the protection region 17. Note that the width of the connection region 18 coincides with, for example, the width of the gate groove 8. In other words, the connection region 18 is formed within the drift region 4 on the bottom surfaces of the gate grooves 8 and the protection regions 17 facing the substrate 1, except for the well region 2 and the source region 3.

Next, a description is given of the basic operation of the semiconductor device according to the second embodiment of the present invention.

Like in the first embodiment, the semiconductor device according to the second embodiment functions as a transistor when the potential of the gate electrode 7 is controlled based on the potential of the source electrode 15 with a positive potential applied to the drain electrode 16. In other words, when the voltage between the gate electrode 7 and the source electrode 15 is equal to or above a predetermined threshold, an inversion layer to be a channel is formed in the well region 2 located at a side surface of the gate electrode 7, bringing the semiconductor device to an ON state, so that currents flow from the drain electrode 16 to the source electrode 15.

On the other hand, when the voltage between the gate electrode 7 and the source electrode 15 is equal to or below the predetermined threshold, the inversion layer in the well region 2 disappears, bringing the semiconductor device to an OFF state, so that currents between the drain electrode 16 and the source electrode 15 are shut off. In this event, a high voltage of several hundreds of V to several thousands of V may be applied between the drain and the source.

As described, in the semiconductor device according to the second embodiment, the channel is formed not under the gate groove 8 where the connection region 18 is formed, but in the well region 2 located at the side surface of the gate electrode 7. For this reason, the connection region 18 does not affect the channel width during the ON state.

Since the semiconductor device according to the second embodiment includes the protection region 17 having the same potential as the source region 3, the depletion layer spreads to the protection region 17 upon application of a high voltage to the drain region 5. Then, the voltage between the gate electrode 7 and the drain region 5 is withstood by the gate insulating film 6 facing the drain region 5, the depletion layer in the protection region 17, and the depletion layer in the drift region 4. Among these, the joint interface between the protection region 17 and the drift region 4 experiences the strongest electric field. Thus, the protection region 17 can protect the gate insulating film 6 from dielectric breakdown and improve voltage withstand performance.

Further, since the semiconductor according to the second embodiment includes the connection region 18 that is in contact with the well region 2 and the protection region 17 and has the same conductivity type as the well region 2 and the protection region 17, the source region 3 and the protection region 17 can be electrically connected to each other. Thus, metal wiring and a contact hole for connecting the protection region 17 are unnecessary, and the surface of the protection region 17 does not need to be wider than a contact hole. For this reason, the element does not increase in size, and the number of elements formable per unit area does not decrease.

In addition, in the semiconductor device according to the second embodiment, the surface area of the protection region 17 does not need to be increased, and therefore the protection region 17 is not wider than the gate groove 8. If the protection region 17 were wider than the gate groove 8, the protection region 17 would hinder flow of main currents from the drain region 5 to the source region 3 in the ON state, possibly increasing the on-resistance per unit area. In the semiconductor according to the second embodiment, the protection region 17 can protect the gate insulating film 6 without increasing on-resistance per unit area.

Further, since the semiconductor device according to the second embodiment includes the connection region 18 formed in contact with the bottom surface of the gate insulating film 6, the flow of main currents is not hindered. In addition, since an inversion layer is formed in the connection region 18 in the ON state, the channel width is increased, and on-resistance can be reduced.

In addition, since the connection region 18 has a higher impurity concentration than the well region 2 in the semiconductor device according to the second embodiment, resistance of the connection region 18 can be reduced, and conductivity can be improved. Thereby, in the semiconductor device according to the second embodiment, it is easy to fix the potentials of the source region 3 and the protection region 17, and the risk of malfunction can be reduced.

Further, in the semiconductor device according to the second embodiment, the substrate 1 is made of an insulator or a semi-insulator, and the end portion of the well region 2 is in contact with the substrate 1. Thus, electric field concentration at the end portion of the well region 2 can be reduced, and voltage withstand performance can be improved even more.

Further, in the semiconductor device according to the second embodiment, the substrate 1 and the drift region 4 are formed of the same material. Thus, the risk of warpage due to stress can be reduced, and the reliability of the element can be improved.

(First Modification)

Figure 17:
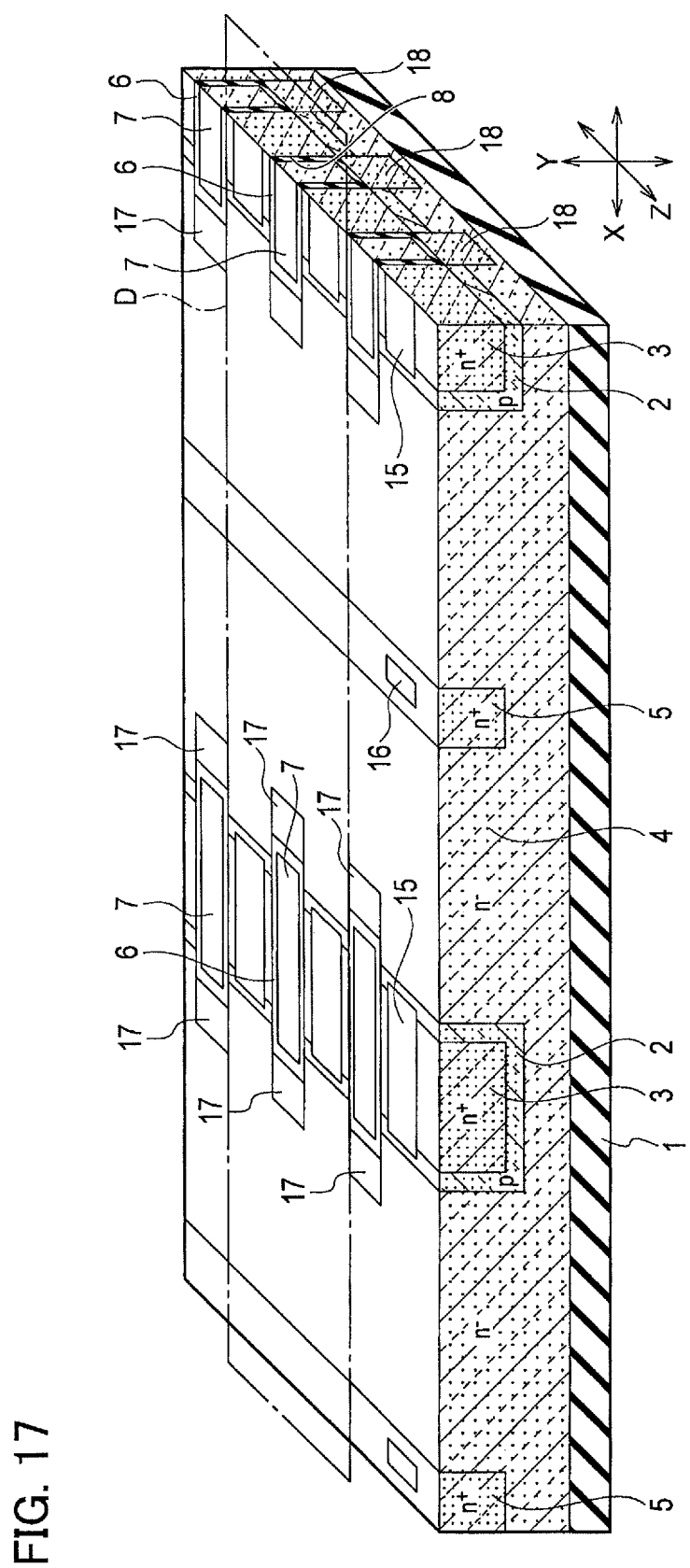
FIG. 17 is a perspective view illustrating a semiconductor device according to a first modification of the second embodiment of the present invention.

FIG. 17 is a perspective view illustrating a semiconductor device according to a first modification of the second embodiment of the present invention. The semiconductor device according to the first modification of the second embodiment differs from the above second embodiment in that a plurality of semiconductor elements and a plurality of semiconductor elements are connected in parallel. Configurations, operations, and advantageous effects not described in the first modification of the second embodiment are substantially the same as those in the above second embodiment and are omitted to avoid repetition.

In the first modification of the second embodiment, a plurality of well regions 2 are arranged parallel to and away from one another, in a direction (the X-axis direction) parallel to the second main surface of the drift region 4 and orthogonal to the direction in which the well regions 2 extend (the Z-axis direction). In the respective well regions 2, a plurality of source regions 3 are formed. A plurality of drain regions 5 are formed so that each drain region 5 may be between adjacent ones of the well regions 2 with spaces from the well regions 2.

The gate grooves 8 extend in a direction (the X-axis direction) which is parallel to the second main surface of the drift region 4 and in which the well regions 2 are arranged, the gate grooves 8 being in contact with the drift region 4 at both sides in the direction (the X-axis direction) in which the well regions 2 are arranged. In other words, the gate grooves 8 penetrate the well region 2 and the source region 3.

The protection regions 17 are formed to be in contact with both end surfaces of each gate groove 8 facing the respective drain regions 5. The connection regions 18 are formed in areas under the gate grooves 8 from both end surfaces of each well region 2 in the direction in which the well regions 2 are arranged (the X-axis direction) to positions in contact with the protection regions 17 located on both sides.

Next, with reference to FIGS. 18 to 29, a description is given of an example method of manufacturing the semiconductor device according to the first modification of the second embodiment. To facilitate an understanding, FIGS. 18 to 29 show unit element cells connected in parallel in the region D in FIG. 17.

Figure 18:
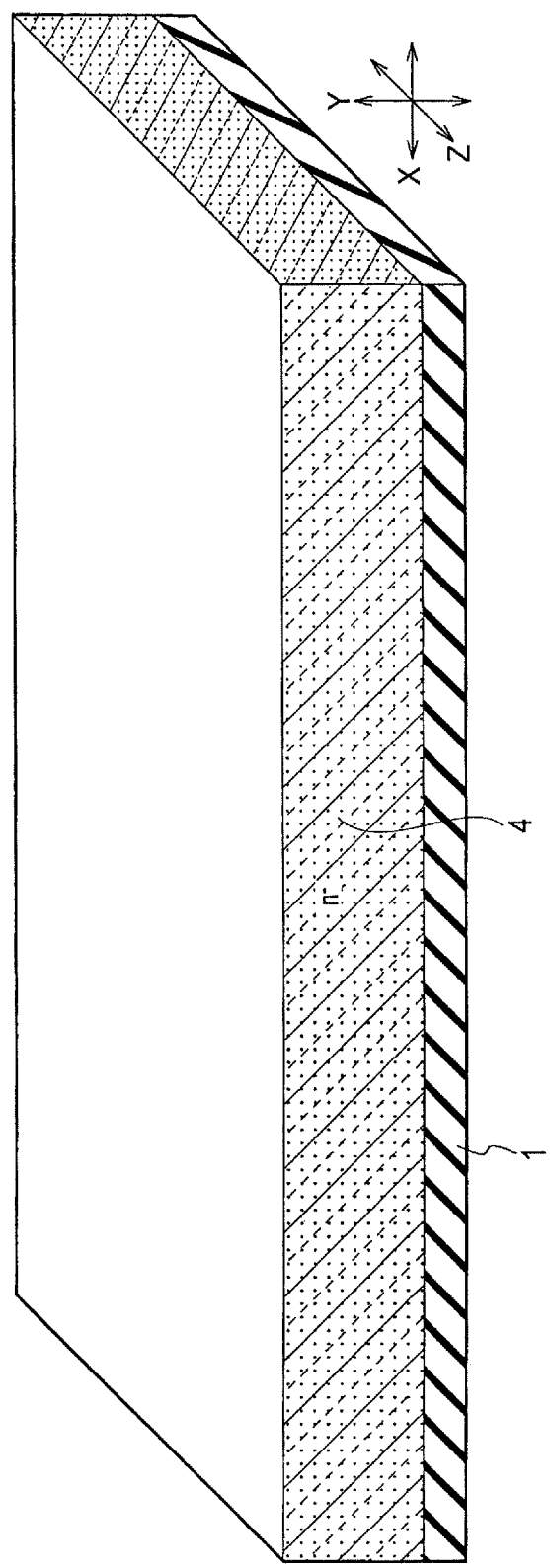
FIG. 18 is a perspective view illustrating a method of manufacturing the semiconductor device according to the first modification of the second embodiment of the present invention.

First, as illustrated in FIG. 18, a substrate 1 is prepared. The substrate 1 is an insulating substrate made of non-doped SiC, and has a thickness of approximately several tens of μm to several hundreds of μm. An n⁻-type SiC epitaxial layer is formed on the substrate 1 as a drift region 4. While there are several polytypes of SiC, the representative 4H is used herein. For example, the drift region 4 formed has an impurity concentration of $1\times10^{14}$ cm$^{-3}$ to $1\times10^{18}$ cm$^{-3}$ and a thickness of a few μm to several tens of μm.

Figure 19:
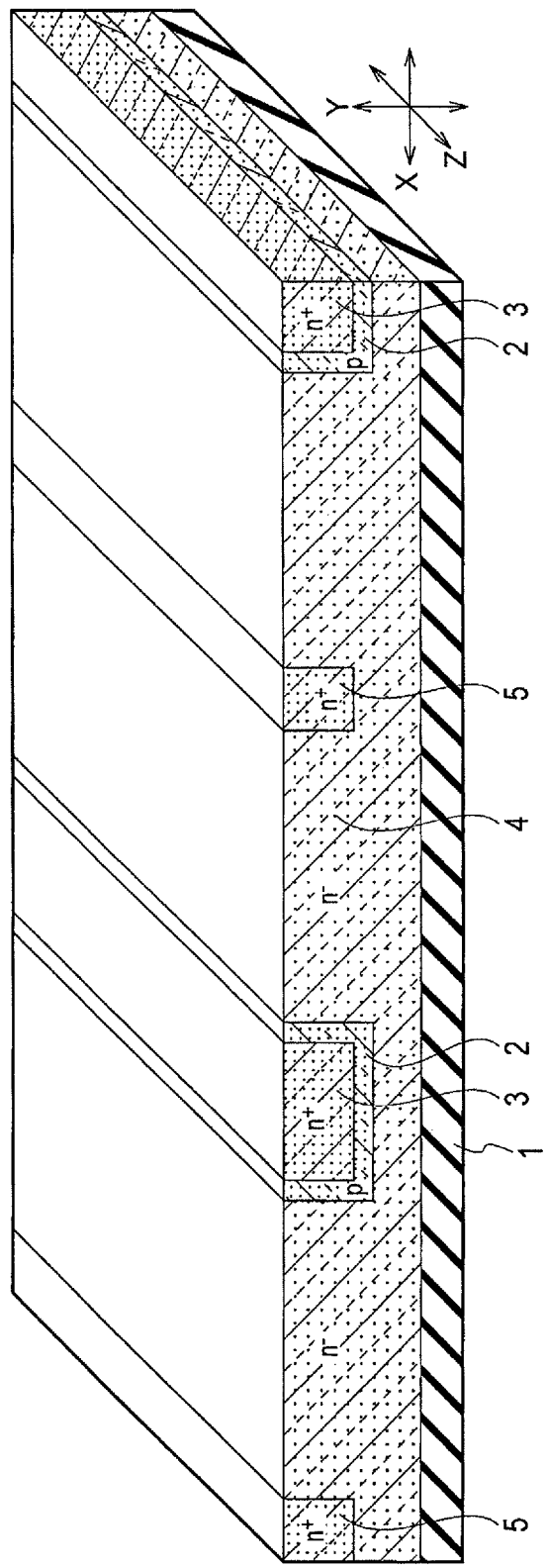
FIG. 19 is a perspective view following FIG. 18, illustrating the method of manufacturing the semiconductor device according to the first modification of the second embodiment of the present invention.

Next, as illustrated in FIG. 19, p-type well regions 2, n⁺-type source regions 3, and n⁺-type drain regions 5 are formed on the drift region 4. The order of the formation is as follows. Preferably, the well regions 2 are formed first. Thereafter, the source regions 3 and the drain regions 5 may be formed simultaneously. The well regions 2, the source regions 3, and the drain regions 5 are formed using ion implantation.

To mask regions not to be ion-implanted, a mask material may be formed on the drift region 4 by the following steps. A silicon oxide film (SiO₂ film) can be used as the mask material, and thermal CVD or plasma CVD can be used as a deposition method. Next, a resist is applied to the mask material and is patterned using typical photolithography. With the patterned resist used as a mask, the mask material is partially and selectively removed by etching. As the etching method, wet etching using hydrofluoric acid or dry etching such as reactive ion etching (RIE) can be used. Next, the resist is removed using oxygen plasma, sulfuric acid, or the like.

Thereafter, with the mask material used as a mask, p-type and n-type impurities are ion-implanted to the drift region 4 to form and the p-type well regions 2 and the n⁺-type source regions 3 and drain regions 5. For example, aluminum (Al) or boron (B) can be used as the p-type impurities. Further, for example, nitrogen (N) can be used as the n-type impurities. In this step, when the ion implantation is performed with the base temperature being heated at approximately 300° C. to 600° C., crystal defects occurring in the implanted region can be reduced. After the ion implantation, the mask material is removed using, for example, wet etching with hydrofluoric acid.

Favorable impurity concentrations of the source regions 3 and the drain regions 5 formed by the above method are $1\times10^{18}$ cm$^{-3}$ to $1\times10^{21}$ cm$^{-3}$, and their implantation depths are shallower than the first main surface of the drift region 4. Further, the impurity concentration of the well regions 2 is favorably $1\times10^{15}$ cm$^{-3}$ to $1\times10^{19}$ cm$^{-3}$. The implantation depth of the well regions 2 may be deeper than the first main surface of the drift region 4, so that the end portions of the well regions 2 reach the inside of the substrate 1. For example, the implantation energy may be MKeV level or higher when the thickness of the drift region 4 is 1 μm or larger.

Figure 20:
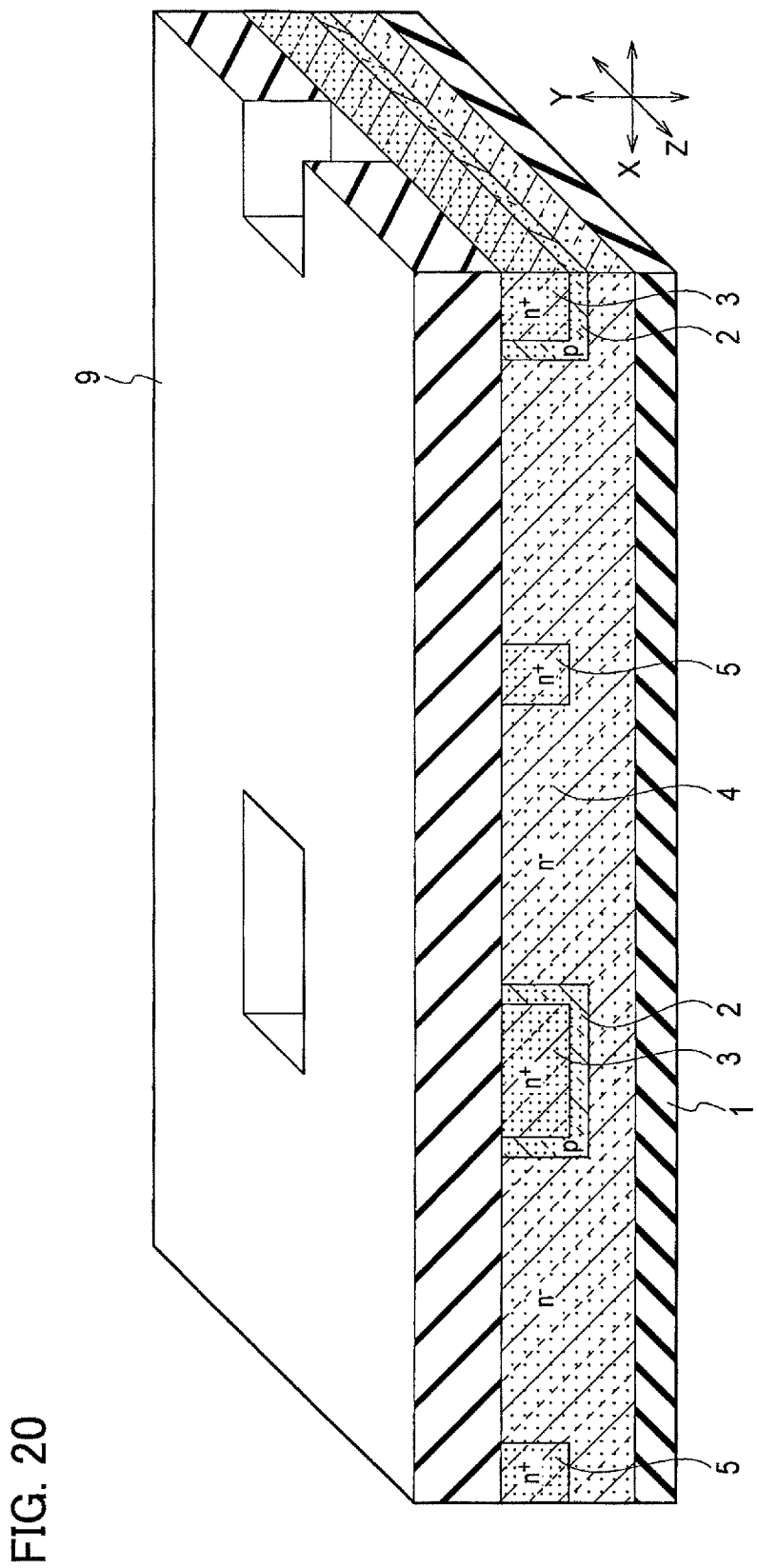
FIG. 20 is a perspective view following FIG. 19, illustrating the method of manufacturing the semiconductor device according to the first modification of the second embodiment of the present invention.

Next, as illustrated in FIG. 20, a mask material 9 is formed to form gate grooves 8 in the drift region 4. A patterned insulating film can be used as the mask material 9, like the mask material used in the step described using FIG. 19.

Figure 21:
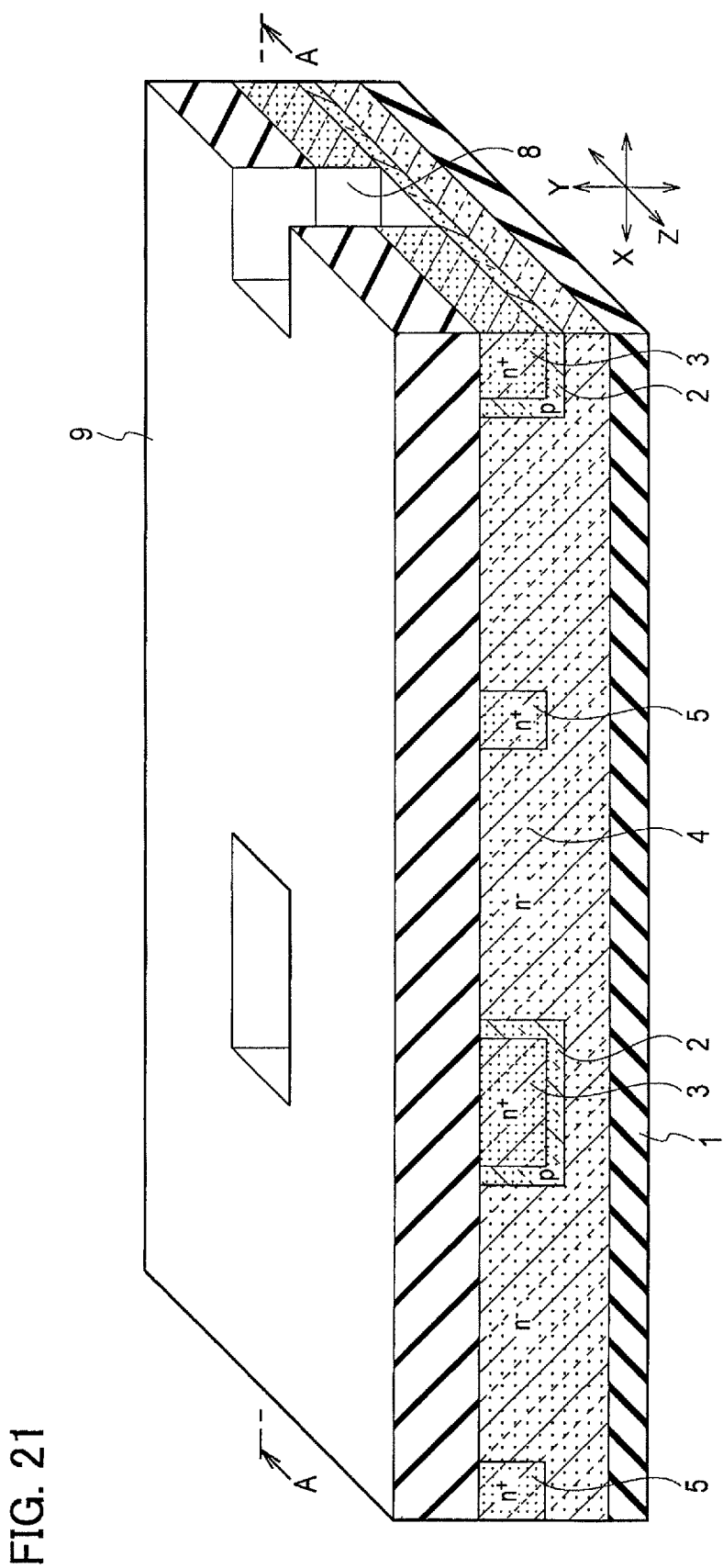
FIG. 21 is a perspective view following FIG. 20, illustrating the method of manufacturing the semiconductor device according to the first modification of the second embodiment of the present invention.
Figure 22:
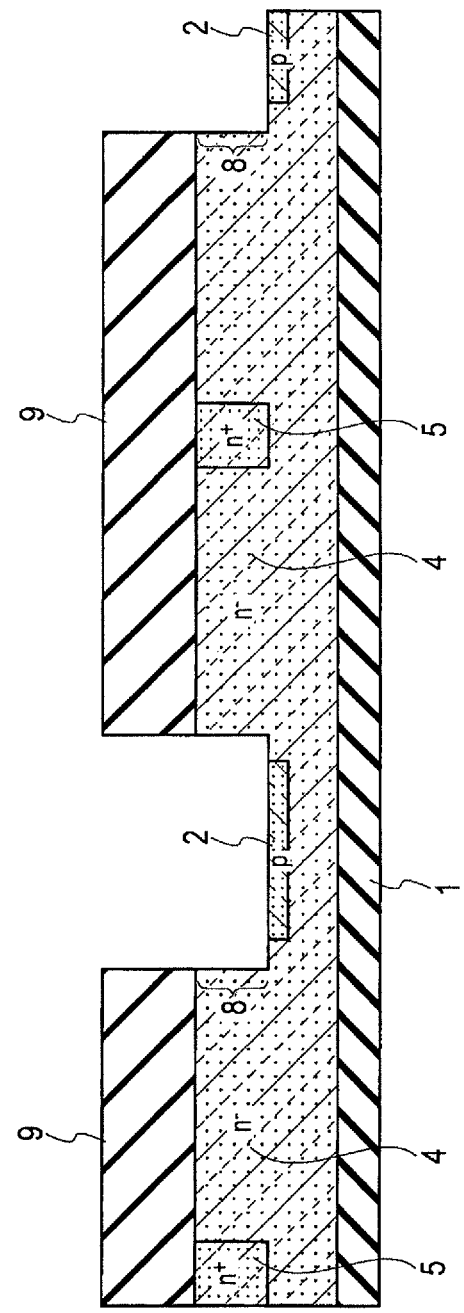
FIG. 22 is a sectional view seen in the direction A-A in FIG. 21.

Next, as illustrated in FIGS. 21 and 22, the gate grooves 8 are formed with the mask material 9 used as a mask. Dry etching such as RIE is favorably used to form the gate grooves 8. The gate grooves 8 are formed shallower than source regions 3 herein, but may be formed deeper than the source regions 3.

Figure 23:
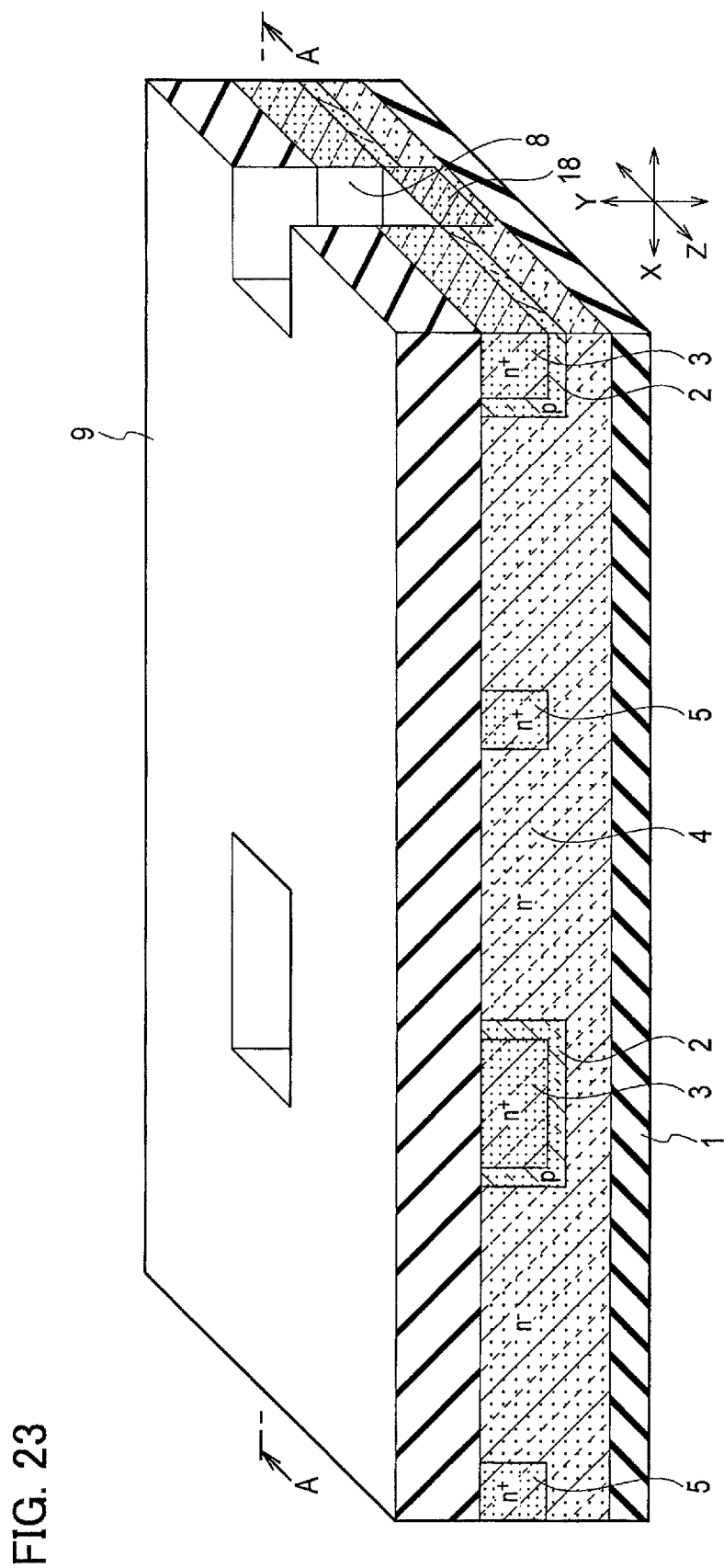
FIG. 23 is a perspective view following FIGS. 21 and 22, illustrating the method of manufacturing the semiconductor device according to the first modification of the second embodiment of the present invention.
Figure 24:
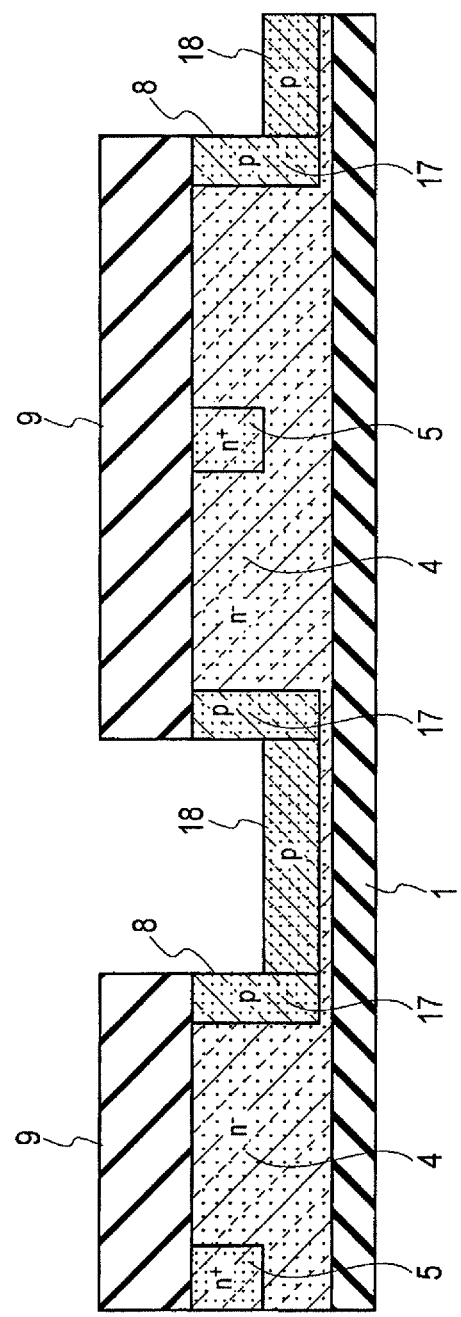
FIG. 24 is a sectional view seen in the direction A-A in FIG. 23.

Next, as illustrated in FIGS. 23 and 24, with the mask material 9 still used as a mask, p-type protection regions 17 and connection regions 18 are formed by self-alignment. By ion implantation in the direction perpendicular to the substrate 1, the connection regions 18 can be easily formed in contact with the bottom surfaces of the gate grooves 8 without positional displacement. By ion implantation in a direction parallel to a section shown in FIG. 24 (the X-Y plane) and having a certain angle relative to the substrate 1, the protection regions 17 can be easily formed without positional displacement only at the end surfaces of the gate grooves 8 facing the drain regions 5. The angle relative to the substrate 1 is preferably 1° to 45° from the perspective of implantation depth. For example, aluminum (Al) or boron (B) can be used as the p-type impurities. The impurity concentration of the connection regions 18 is higher than that of the well regions 2, and the implantation depth is preferably approximately several hundred of nm. When the ion implantation is performed with the base temperature heated at approximately 300° C. to 600° C., crystal defects occurring in the implanted region can be reduced. After the ion implantation, the mask material 9 is removed using, for example, hydrofluoric acid cleaning if the mask material 9 is a silicon oxide film.

Next, the ion-implanted impurities are annealed to be activated. The annealing temperature is, for example, approximately 1700° C., and argon (Ar) or nitrogen ($N_2$) can be favorably used as the atmosphere. By this activation, the well regions 2, the source regions 3, the drain regions 5, the protection regions 17, and the connection regions 18 are formed.

Figure 25:
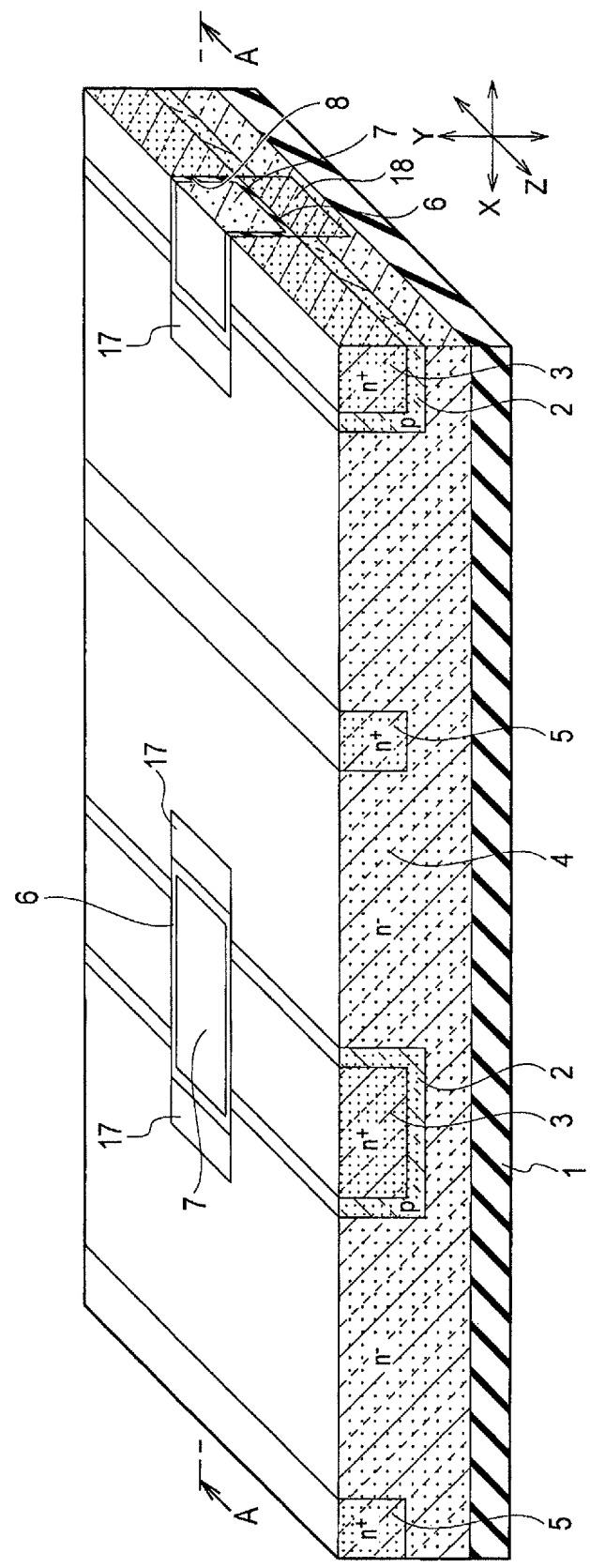
FIG. 25 is a perspective view following FIGS. 23 and 24, illustrating the method of manufacturing the semiconductor device according to the first modification of the second embodiment of the present invention.
Figure 26:
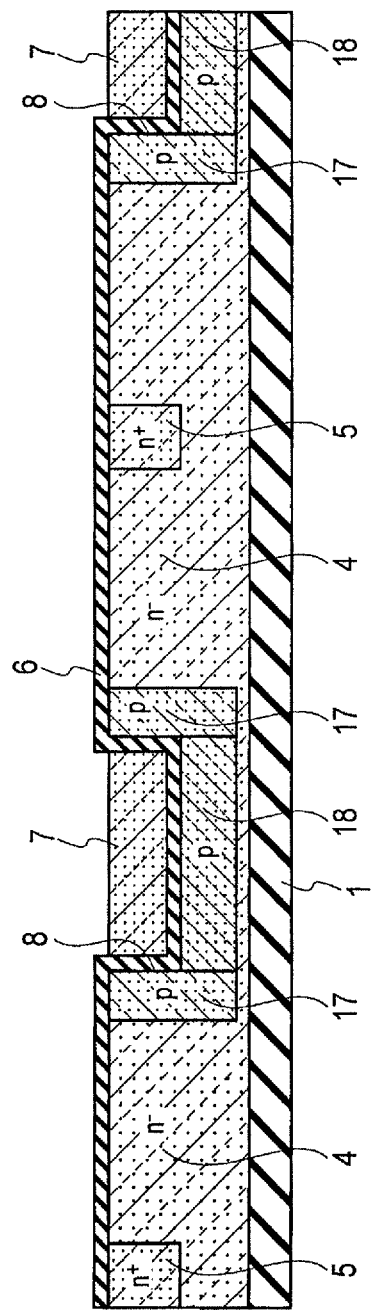
FIG. 26 is a sectional view seen in the direction A-A in FIG. 25.

Next, as illustrated in FIGS. 25 and 26, a gate insulating film 6 and gate electrodes 7 are formed. Specifically, first, the gate insulating film 6 is formed on the drift region 4 and the surfaces of the gate grooves 8 by the thermal oxidation method or the deposition method. For example, in the case of thermal oxidation, when the base is heated at a temperature of approximately 1100° C. in an oxygen atmosphere, a silicon oxide film is formed on all the portion of the base that is in contact with oxygen. After the formation of the gate insulating film 6, annealing at approximately 1000° C. may be performed in an atmosphere of nitrogen, argon, nitrous oxide ($N_2O$), or the like to reduce the interface state of the interfaces between the well regions 2 and the gate insulating film 6.

Thereafter, a material to be the gate electrodes 7 is deposited on the surface of the gate insulating film 6. Polysilicon is usable as the material for the gate electrodes 7. The following description assumes that polysilicon is used to form the gate electrodes 7. For the polysilicon deposition, low-pressure CVD may be used. Each gate groove 8 can be completely embedded with the polysilicon when the thickness of the polysilicon deposited is more than half the width of the gate groove 8. For example, when the width of the gate groove 8 is 2 μm, the thickness of polysilicon is more than 1 μm. After the polysilicon deposition, annealing is performed at approximately 950° C. in an atmosphere of phosphoryl chloride ($POCl_3$), thereby forming n-type polysilicon and giving conductivity to the gate electrodes 7.

Next, the polysilicon of the gate electrodes 7 is etched by isotropic etching or anisotropic etching. The amount of etching is set so that the polysilicon may remain in the gate grooves 8. For example, when the width of each gate groove 8 is 2 μm and the thickness of the polysilicon deposited is 1.5 μm, a desirable amount of etching is 1.5 μm. Note that it is not problematic even if the polysilicon is over-etched by several percentage relative to the polysilicon thickness 1.5 μm due to etching control. FIGS. 25 and 26 illustrate the structure after the etching of the polysilicon. Note that, to facilitate an understanding, FIG. 25 does not show the insulating film formed on the surface of the drift region 4 in the formation of the gate insulating film 6, but actually, the insulating film may be formed on the surface of the drift region 4 as well, as illustrated in FIG. 26.

Figure 27:
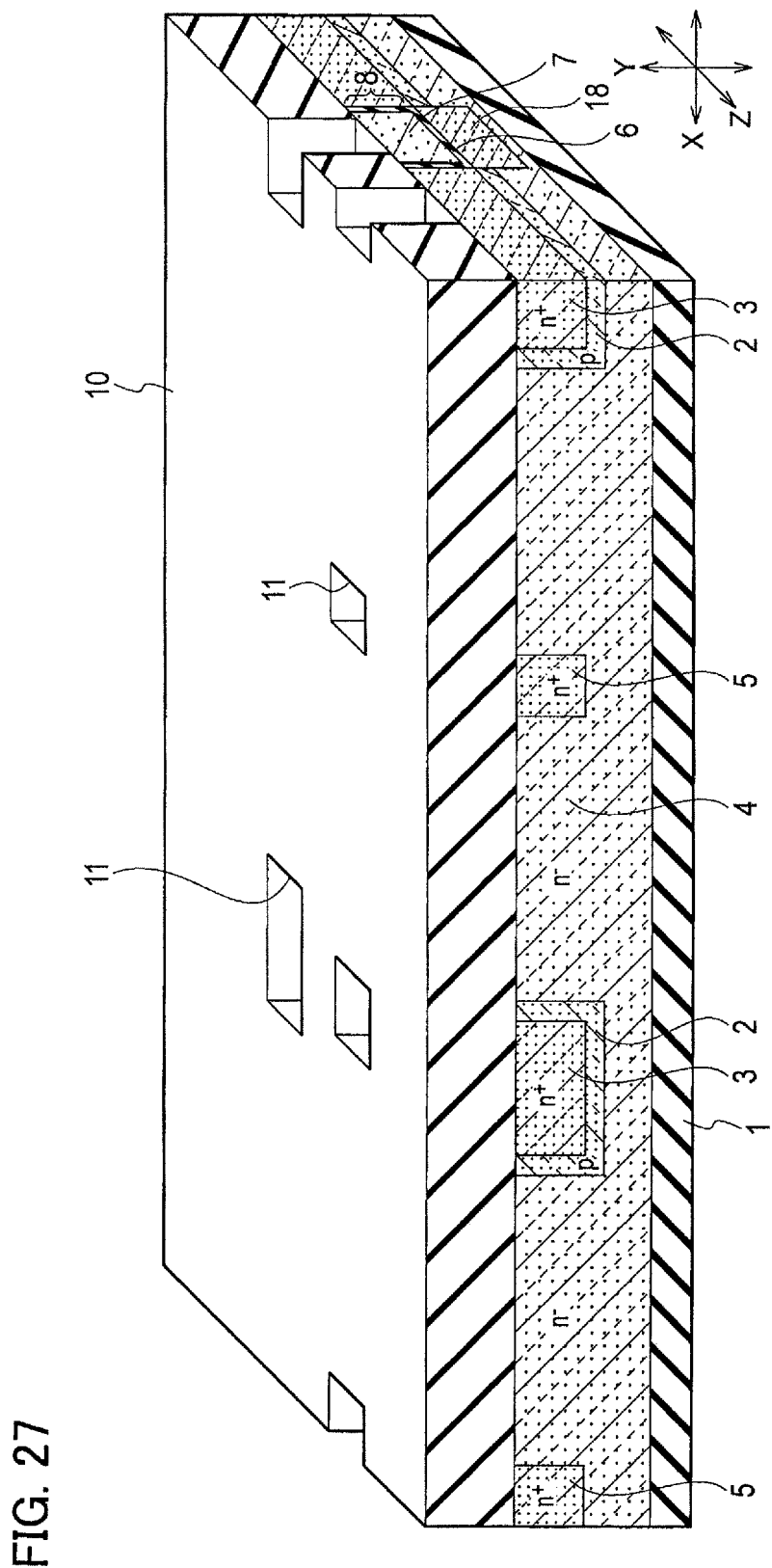
FIG. 27 is a perspective view following FIGS. 25 and 26, illustrating the method of manufacturing the semiconductor device according to the first modification of the second embodiment of the present invention.
Figure 28:
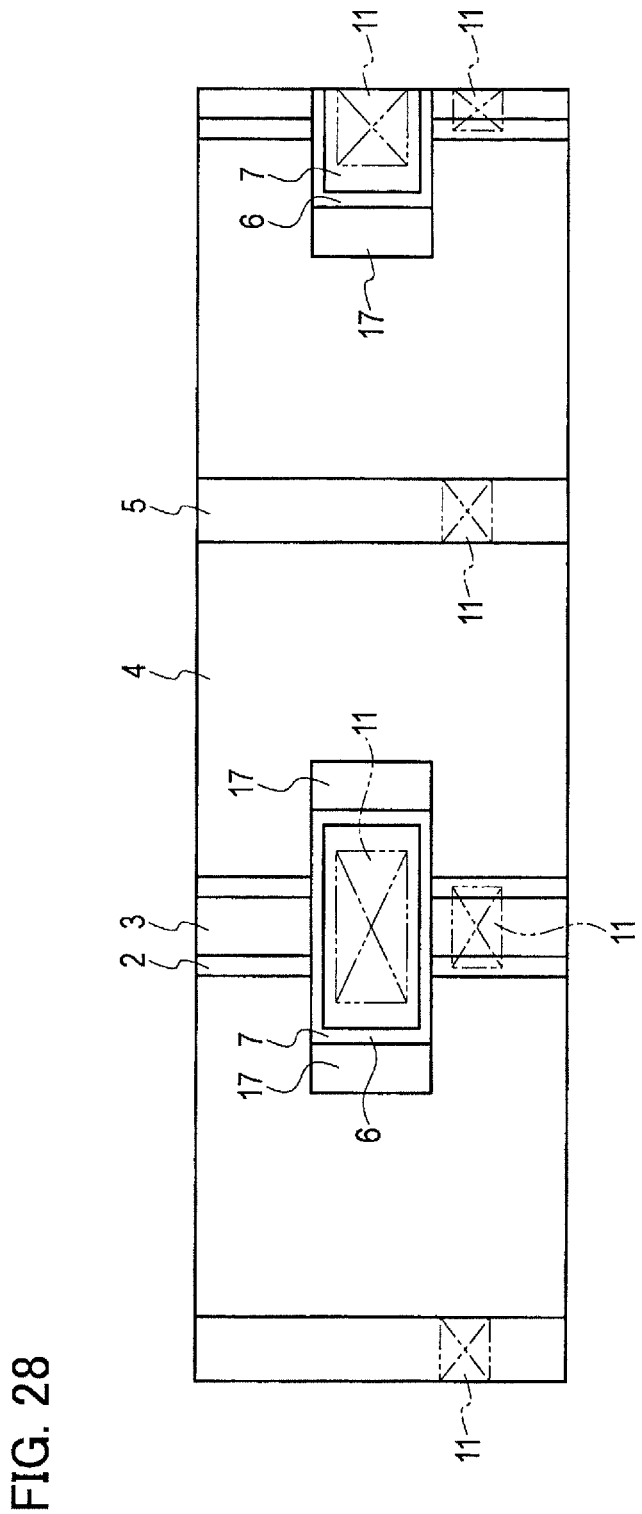
FIG. 28 is a top view corresponding to FIG. 27.

Next, as illustrated in FIGS. 27 and 28, an interlayer insulating film 10 is formed, and contact holes 11 for electrodes are formed. To facilitate an understanding, FIG. 27 does not show the interlayer insulating film 10 and shows only the positions of the contact holes 11. Generally, a silicon oxide film is favorable as the interlayer insulating film 10, and a usable deposition method is thermal CVD or plasma CVD. After the deposition of the interlayer insulating film 10, a resist is applied to the interlayer insulating film 10 and is patterned using typical photolithography (not shown). With the patterned resist used as a mask, the interlayer insulating film 10 is partially and selectively removed by wet etching using hydrofluoric acid or dry etching such as reactive ion etching (RIE) to form the contact holes 11. Thereafter, the resist is removed using oxygen plasma or sulfuric acid.

Figure 29:
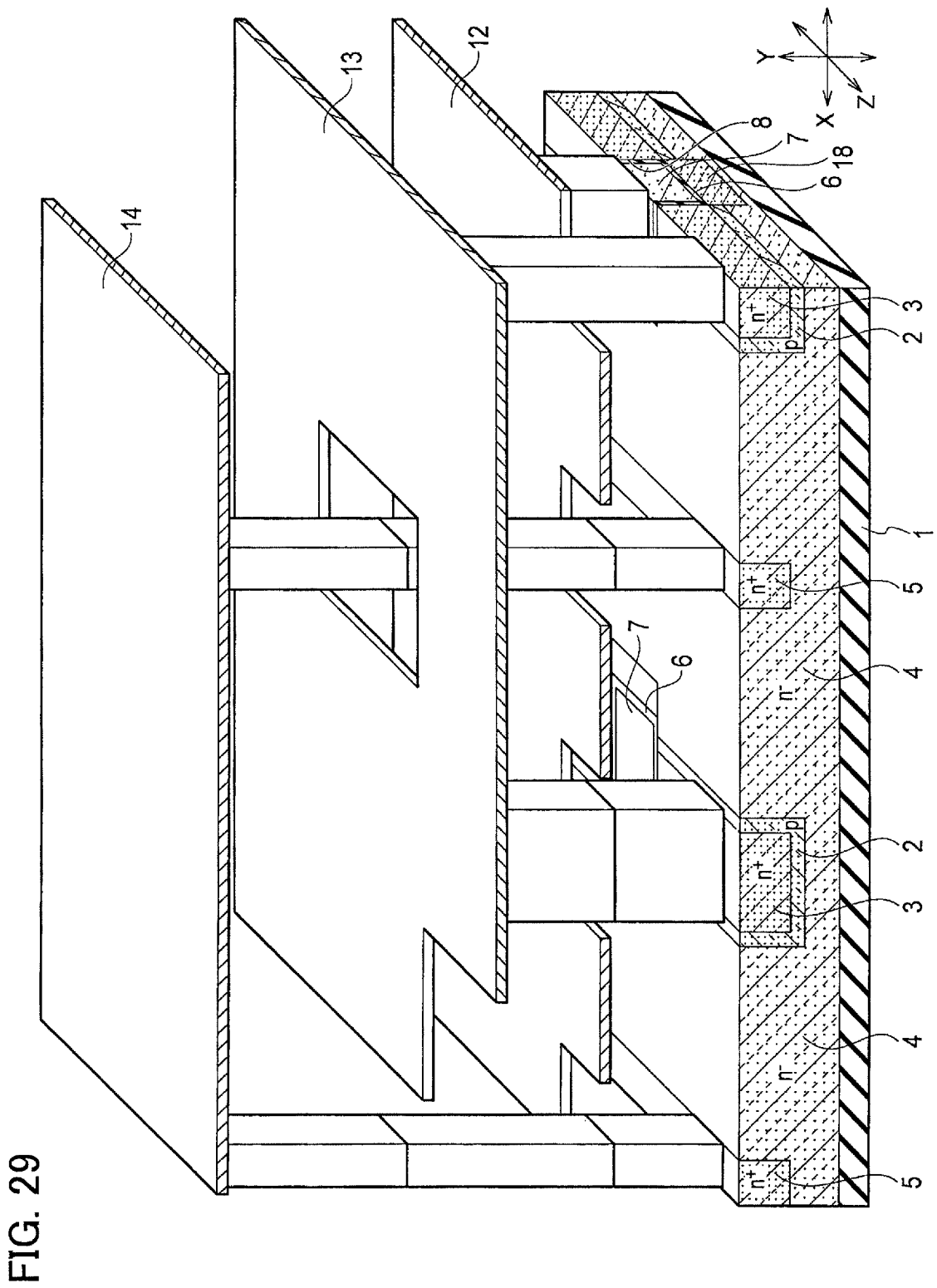
FIG. 29 is a perspective view following FIGS. 27 and 28, illustrating the method of manufacturing the semiconductor device according to the first modification of the second embodiment of the present invention.

Next, as illustrated in FIG. 29, gate wiring 12, source wiring 13, and drain wiring 14 are formed. To facilitate an understanding, FIG. 29 does not show interlayer illustrating films between the drift region 4, the gate wiring 12, the source wiring 13, and the drain wiring 14. As a wiring material, a metal material such as titanium (Ti), nickel (Ni), or molybdenum (Mo) is usable. The following description assumes that Ti is used to form the gate wiring 12, the source wiring 13, and the drain wiring 14. First, Ti is deposited using metal organic chemical vapor deposition (MOCVD) or the like. Next, with a resist or the like used as a mask, the Ti is selectively etched. Next, an interlayer insulating film between the gate wiring 12 and the source wiring 13 is deposited, and contact holes are formed. Sputtering or the like is favorably used for the deposition of the interlayer insulating film, and the contact holes can be formed in the same manner as the step described using FIGS. 27 and 28. Next, a metal material to be the source wiring 13 is deposited and then etched by the same method used for the formation of the gate wiring 12. Subsequently, an interlayer insulating film between the source wiring 13 and the drain wiring 14 is deposited, contact holes are formed, and a metal material to be the drain wiring 14 is deposited. FIG. 29 shows a semiconductor device after the formation of the drain wiring 14. The semiconductor device illustrated in FIG. 17 is completed after the steps described above.

The method of manufacturing the semiconductor device according to the first modification of the second embodiment can obtain a semiconductor device illustrated in FIG. 17 with improved voltage withstand performance without being increased in size.

Further, in the semiconductor device according to the first modification of the second embodiment, the protection regions 17 adjacent in the direction in which main currents flow (the X-axis direction) and the drift region 4 sandwiched by these protection regions 17 are fully depleted at a predetermined drain voltage or higher. Thereby, voltage withstand performance can be improved even more.

(Second Modification)

Figure 30:
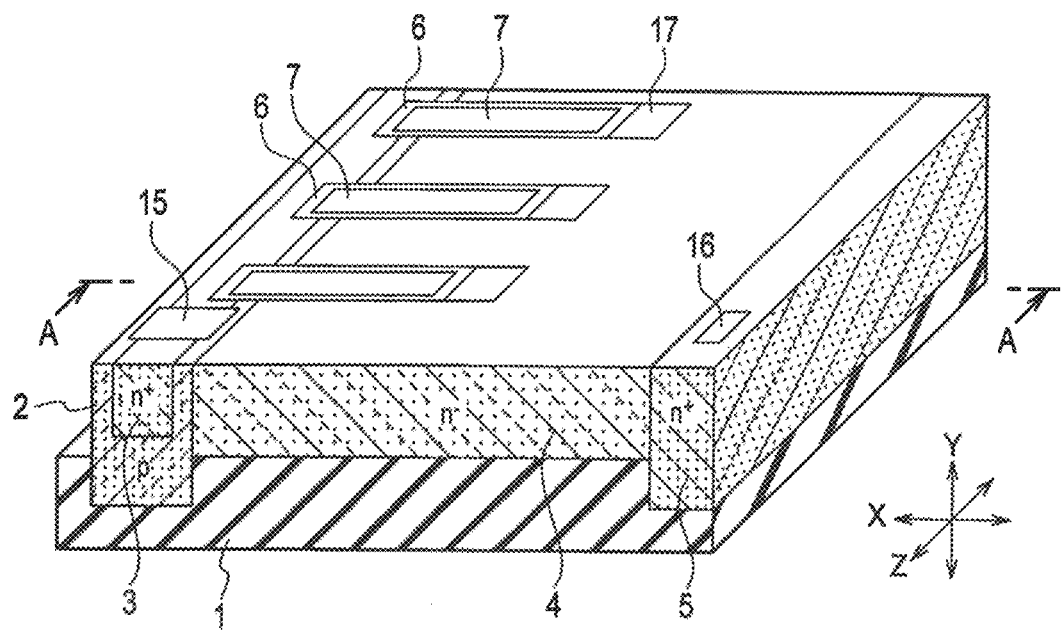
FIG. 30 is a perspective view of a semiconductor device according to a second modification of the second embodiment of the present invention.
Figure 31:
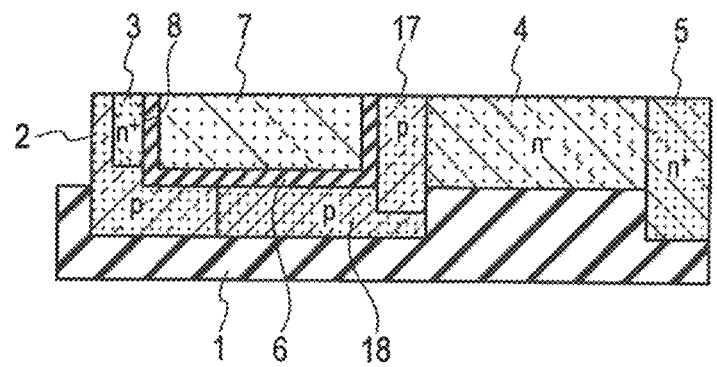
FIG. 31 is a sectional view seen in the direction A-A in FIG. 30.

FIG. 30 is a perspective view illustrating a semiconductor device according to a second modification of the second embodiment of the present invention. FIG. 31 is a sectional view seen in the direction A-A in FIG. 30. The semiconductor device according to the second modification of the second embodiment differs from the above second embodiment in that at least part of the protection regions 17 and of the connection regions 18 are formed within the substrate 1. Configurations, operations, and advantageous effects not described in the second modification of the second embodiment are substantially the same as those in the above embodiment and are omitted to avoid repetition.

In the second modification of the second embodiment, the bottom surface of each gate groove 8 is situated at the first main surface of the substrate 1 or inside the substrate 1. In addition, the depths of the well region 2 and the drain region 5 are larger than the thickness of the drift region 4. Specifically, in a direction (the Y-axis direction) perpendicular to the second main surface of the drift region 4, the end surfaces of the well region 2 and the drain region 5 extend into the substrate 1. Similarly, the depth of the source region 3 may be larger than the thickness of the drift region 4. The connection region 18 is formed within the substrate 1, on the bottom surfaces of the gate groove 8 and the protection region 17 facing the substrate 1, except for the well region 2 and the source region 3. Thereby, inside the substrate 1, the connection region 18 is electrically connected to the well region 2 and the protection region 17.

Figure 32:
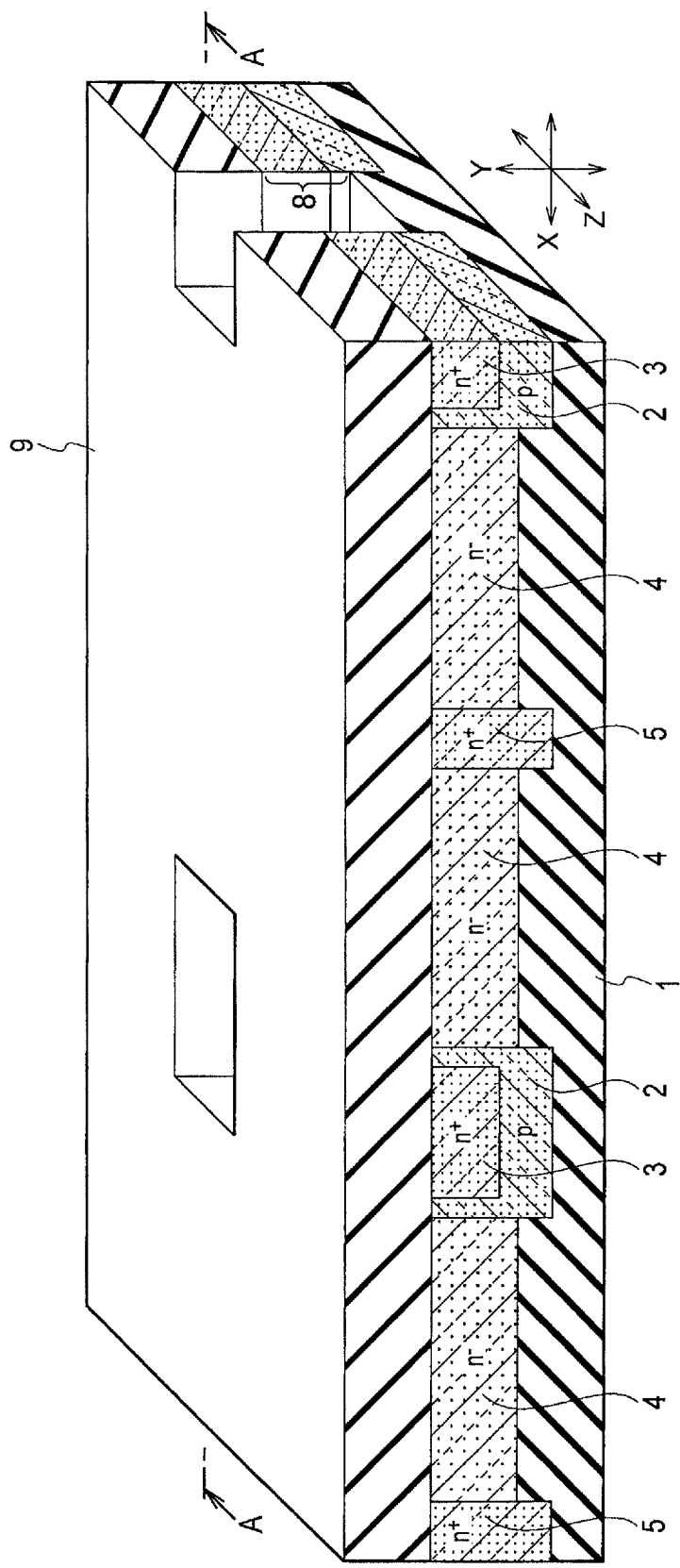
FIG. 32 is a perspective view illustrating a method of manufacturing the semiconductor device according to the second modification of the second embodiment of the present invention.
Figure 33:
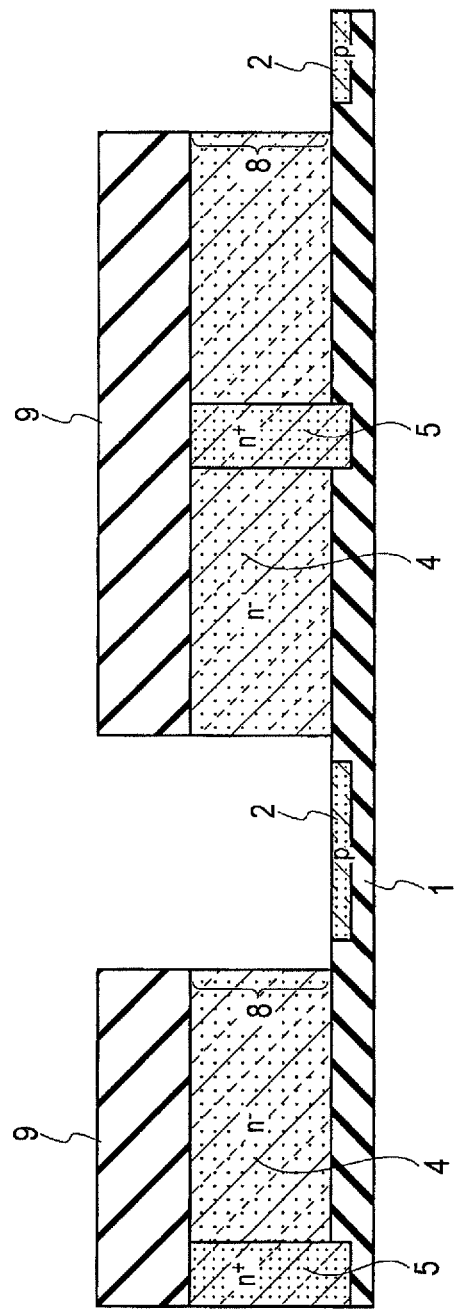
FIG. 33 is a sectional view seen in the direction A-A in FIG. 32.

To manufacture the semiconductor device of the second modification of the second embodiment, as illustrated in FIGS. 32 and 33, with a mask material 9 used as a mask, the gate grooves 8 are formed so that their bottom surfaces reach the first main surface of the substrate 1 or the inside of the substrate 1. Dry etching such as RIE is favorably used to form the gate grooves 8. Thereafter, as described using FIGS. 23 and 24, with the mask material 9 still used as a mask, p-type protection regions 17 and connection regions 18 can be formed by self-alignment. By ion implantation in the direction perpendicular to the substrate 1, the connection regions 18 can be easily formed inside the substrate 1, in contact with the bottom surfaces of the gate grooves 8 without positional displacement. By ion implantation in a direction parallel to a section shown in FIG. 33 and having a certain angle relative to the substrate 1, the protection regions 17 can be easily formed without positional displacement with part thereof reaching the inside of the substrate 1. Note that the configuration illustrated in FIGS. 32 and 33 corresponds to the configuration illustrated in FIGS. 21 and 22, and the step described using in FIGS. 32 and 33 corresponds to the step described using FIGS. 21 and 22.

According to the semiconductor device according to the second modification of the second embodiment, at least part of the connection region 18 is formed inside the substrate 1 made of an insulator or a semi-insulator. Thereby, the junction capacitance between the connection region 18 and the drift region 4 is reduced, and thus responsiveness of the semiconductor device improves to make high-speed operation possible.

Further, in the semiconductor device according to the second modification of the second embodiment, at least part of the protection region 17 is formed inside the substrate 1. Thereby, electric field concentration at the end portion of the protection region 17 can be mitigated, and voltage withstand performance can be improved even more.

Furthermore, in the semiconductor device according to the second modification of the second embodiment, the substrate 1 and the drift region 4 are made of the same material. Thus, even if the well regions 2 or the protection regions 17 are formed deeper than the thickness of the drift region 4, they can be easily formed with one type of p-type impurities.

Other Embodiments

As described above, the present invention has been described using the above embodiments, but it should not be understood that the description and drawings which constitute part of this disclosure limit the present invention. From this disclosure, various alternative embodiments, examples, and operation techniques will be easily found by those skilled in the art.

For example, although the first and second embodiments describe a case of manufacturing a semiconductor device on the substrate 1 made of SiC, the material of the substrate 1 is not limited to SiC. For example, as the material of the substrate 1, a semiconductor having a wide bandgap can be used. Examples of a semiconductor with a wide bandgap include gallium nitride (GaN), diamond, zinc oxide (ZnO), and aluminum gallium nitride (AlGaN).

In addition, although the first and second embodiments describe a case of using n-type polysilicon for the gate electrodes 7, p-type polysilicon may be used. Further, the gate electrodes 7 may be a different semiconductor material, or a different conductive material such as a metal material. For example, p-type polysilicon carbide, silicon germanium (SiGe), aluminum (Al), or the like can be used as a material for the gate electrode 7. Similarly, as the materials for the source electrode 15 and the drain electrode 16, metal may be used, or alloys of a semiconductor and a metal or other conductors may be used.

In addition, although the first and second embodiments describe a case of using a silicon oxide film as the gate insulating film 6, a silicon nitride film may be used, or a stack of a silicon oxide film and a silicon nitride film may be used. If the gate insulating film 6 is a silicon nitride film and isotropic etching is performed, the etching can be performed with, for example, cleaning with phosphoric acid heated to 160° C.

In addition, although the first and second embodiments describe a case of forming the drift region 4 by epitaxial growth, the drift region 4 may be formed by implantation of n-type impurities into an insulating substrate made of SiC or the like.

In addition, in the first and second embodiments, the substrate 1 may be formed of an n-type semiconductor having a lower impurity concentration than the drift region 4. Thereby, when the semiconductor device is in the ON state, currents flow inside the substrate 1, and the path for currents widens, increasing currents. If the substrate 1 were a p-type semiconductor, a depletion layer widens in the drift region 4 to narrow the current path, decreasing currents. In other words, when the substrate 1 has the same conductivity type as the drift region 4, currents increase, and loss is decreased.

In addition, although the first and second embodiments describe a case where a MOSFET is an example of a semiconductor device, it goes without saying that the semiconductor devices according to the embodiments of the present invention are applicable to an insulated gate bipolar transistor (IGBT) or a thyristor.

In addition, terms such as "parallel", "perpendicular", and "orthogonal" in the first and second embodiments are not based on complete topology, and allow incomplete topology for the reasons of photolithography or other processes.

Additionally, the present invention naturally includes various embodiments which are not described herein, such as configurations in which the above configurations are applied to one another. Accordingly, the technical scope of the present invention should be determined only by the matters to define the invention in the scope of claims regarded as appropriate based on the description.

REFERENCE SIGNS LIST 1 substrate
2 well region
3 source region
4 drift region
5 drain region
6 gate insulating film
7 gate electrode
8 gate groove
15 source electrode
16 drain electrode
17 protection region
18 connection region

The invention claimed is:

1. A semiconductor device comprising:
a substrate;
a drift region of a first conductivity type formed on a first main surface of the substrate and having a higher impurity concentration than the substrate;
a well region of a second conductivity type extending in the drift region from a second main surface of the drift region in a direction perpendicular to the second main surface, the second main surface being opposite from a first main surface of the drift region in contact with the substrate;
a source region of the first conductivity type extending in the well region from the second main surface in the perpendicular direction;
a gate groove formed from the second main surface in the perpendicular direction and extending in contact with the source region, the well region in a direction parallel to the second main surface, and the drift region;
a drain region of the first conductivity type formed away from the well region in the drift region and extending from the second main surface in the perpendicular direction;
a gate insulating film formed on a surface of the gate groove;
a gate electrode formed on a surface of the gate insulating film;
a source electrode electrically connected to the source region and the well region;
a drain electrode electrically connected to the drain region;
a protection region of the second conductivity type formed in the drift region, on a surface of the gate insulating film facing the drain region; and
a connection region of the second conductivity type formed in the drift region while being in contact with the well region and the protection region, wherein
the well region and the protection region are electrically connected to each other by the connection region.

2. The semiconductor device according to claim 1, wherein the connection region is formed in contact with a bottom surface of the gate insulating film facing the substrate.

3. The semiconductor device according to claim 1, wherein at least part of the connection region is formed inside the substrate.

4. The semiconductor device according to claim 1, wherein at least part of the protection region is formed inside the substrate.

5. The semiconductor device according to claim 1, wherein the connection region has a higher impurity concentration than the well region.

6. The semiconductor device according to claim 1, wherein the connection region is in contact with the source electrode.

7. The semiconductor device according to claim 6, wherein the connection region is in contact with the source electrode at a position deeper than the second main surface.

8. The semiconductor device according to claim 1, further comprising a plurality of the protection regions, wherein adjacent protection regions and the drift region sandwiched by the adjacent protection regions are fully depleted at a predetermined voltage.

9. The semiconductor device according to claim 1, wherein the substrate is made of an insulator or a semi-insulator.

10. The semiconductor device according to claim 1, wherein the drift region and the substrate are formed of the same material.

11. The semiconductor device according to claim 1, wherein the protection region is in contact with an entire end surface of the gate groove facing the drain region.

12. The semiconductor device according to claim 1, wherein
a depth of the protection region is equal to a depth of the gate groove, and
a width of the protection region is equal to a width of the gate groove.

13. The semiconductor device according to claim 1, wherein the connection region is formed from the second main surface of the drift region to a depth shallower than a depth of the gate groove.

* * * * *